US007232722B2

(12) United States Patent
Van Houdt et al.

(10) Patent No.: US 7,232,722 B2
(45) Date of Patent: Jun. 19, 2007

(54) METHOD OF MAKING A MULTIBIT NON-VOLATILE MEMORY

(75) Inventors: Jan Van Houdt, Bekkevoort (BE); Luc Haspeslagh, Lubbeek-Linder (BE)

(73) Assignees: Interuniversitair Microelektronica Centrum vzw, Leuven (BE); Infineon AG, Munich (DE)

( * ) Notice: Subject to any disclaimer, the term of this patent is extended or adjusted under 35 U.S.C. 154(b) by 0 days.

(21) Appl. No.: 11/040,516

(22) Filed: Jan. 20, 2005

(65) Prior Publication Data

US 2005/0190606 A1 Sep. 1, 2005

Related U.S. Application Data

(62) Division of application No. 10/603,426, filed on Jun. 24, 2003, now Pat. No. 6,897,517.

(60) Provisional application No. 60/391,565, filed on Jun. 24, 2002.

(51) Int. Cl.
*H01L 21/336* (2006.01)

(52) U.S. Cl. ............ 438/257; 438/201; 438/211; 438/266; 438/593

(58) Field of Classification Search ............ 438/257, 438/266, 593
See application file for complete search history.

(56) References Cited

U.S. PATENT DOCUMENTS

| 4,794,565 A | 12/1988 | Wu et al. |
|---|---|---|
| 5,278,439 A | 1/1994 | Ma et al. |
| 5,280,446 A | 1/1994 | Ma et al. |
| 5,284,784 A | 2/1994 | Manley |
| 5,338,952 A | 8/1994 | Yamauchi |
| 5,394,360 A | 2/1995 | Fukumoto |
| 5,538,811 A | 7/1996 | Kanbara et al. |
| 5,587,332 A | 12/1996 | Chang et al. |
| 6,044,015 A | 3/2000 | Van Houdt et al. |
| 6,362,057 B1 * | 3/2002 | Taylor et al. ............ 438/286 |
| 6,366,500 B1 | 4/2002 | Ogura et al. |
| 6,580,120 B2 | 6/2003 | Haspeslagh |
| 2002/0005545 A1 | 1/2002 | Widdershoven et al. |
| 2002/0094637 A1 * | 7/2002 | Liu et al. ............ 438/257 |

FOREIGN PATENT DOCUMENTS

EP        1 096 572 A1      5/2001

OTHER PUBLICATIONS

Esquivel, et al., "High density contactless, self aligned EPROM cell array technology", IEDM Tech. Dig., pp. 592-595, (1986).
Hayashi, et al., "Twin MONOS cell with dual control gates", IEEE, presented at the 2000 Symposium on VLSI Technology Digest of Technical Papers, pp. 122-123, (2000).
*Microlithography, Science and Technology*, Sheats, et al., Eds., Marcel Dekker, Inc., New York, New York, pp. 515-565 and 615-644, (1998).
Miyawaki, et al., "A new erasing and row decoding scheme for low supply voltage operation 16-Mb/64-Mb flash memories", IEEE Journal of Solid-State Circuits, vol. 27, No. 4, pp. 583-588, (Apr. 1992).
Tanaka, et al., "A quick intelligent page-programming architecture and a shielded bitline sensing method for 3V-only NAND flsh memory", IEEE Hournal of Solid-State Circuits, vol. 29, No. 11, pp. 1366-1373, (Nov. 1994).

(Continued)

*Primary Examiner*—Andy Huynh
(74) *Attorney, Agent, or Firm*—Knobbe Martens Olson & Bear, LLP

(57) ABSTRACT

The present invention relates to a method of making a multibit non-volatile memory and especially to a method of making a flash memory such as a fast-programmable Flash EEPROM (Electrically Erasable Programmable Read-Only Memory) device relying on hot-electron injection for programming which is particularly suited for high density low-voltage low-power applications and employs only two polysilicon layers.

21 Claims, 21 Drawing Sheets

OTHER PUBLICATIONS

Van Houdt, et al., "A 5-volt-only fast-programming flash EEPROM cell with a double polysilicon split-gate structure", presented at the 11th IEEE Non-volatile Semiconductor Memory Workshop, (Feb. 1991).

Van Houdt, et al., Analysis of the enhanced hot-electron injection in split-gate transistors useful for EEPROM applications, IEEE Transactions on Electron Devices, vol. 39, No. 5, pp. 1150-1156, (May 1992).

Van Houdt, et al., "HIMOS-A high efficiency flash E2PROM cell for embedded memory applications", IEEE Transactions on Electron Devices, vol. 40, No. 12, pp. 2255-2263, (Dec. 1993).

Yamauchi, et al., "A 5V-only virtual ground flash cell with an auxilliary gate for high density and high speed application", IEDM Tech. Dig., pp. 319-322, (1991).

US 5,841,697, 11/1998, Van Houdt et al. (withdrawn)

* cited by examiner

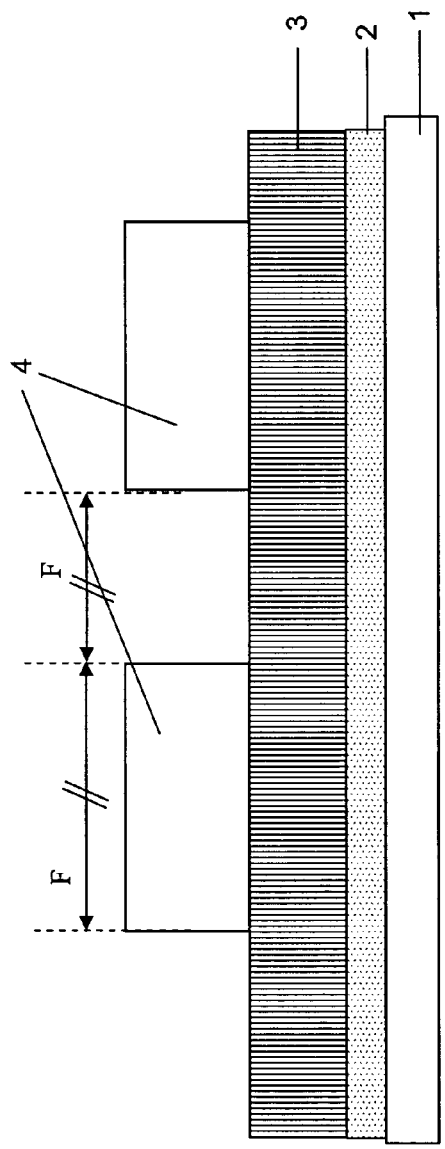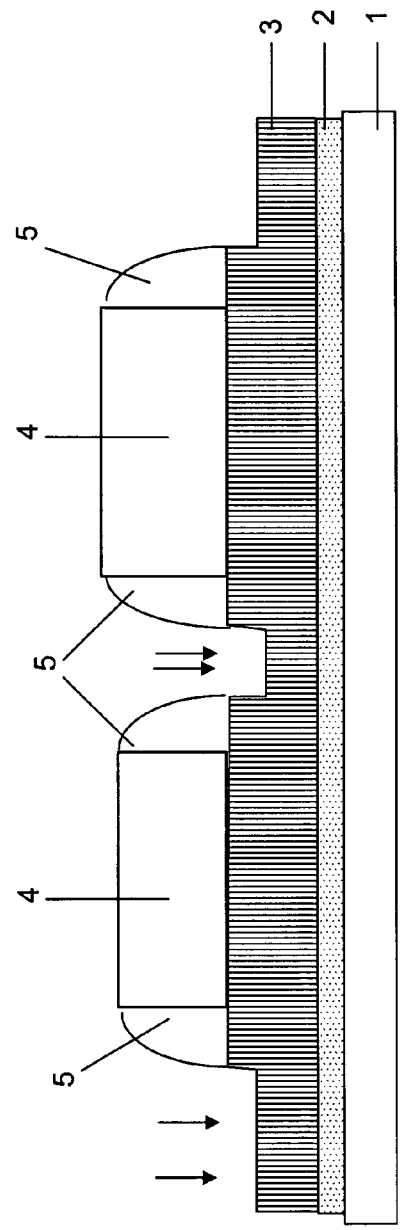

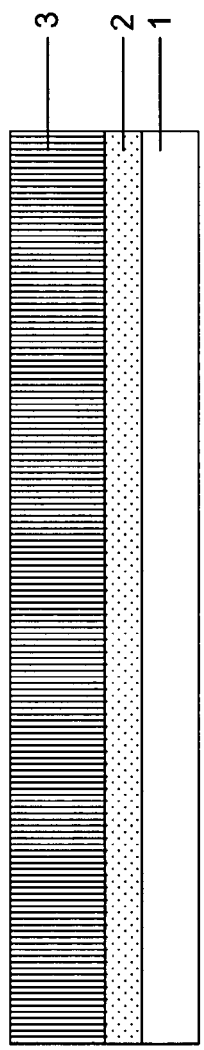
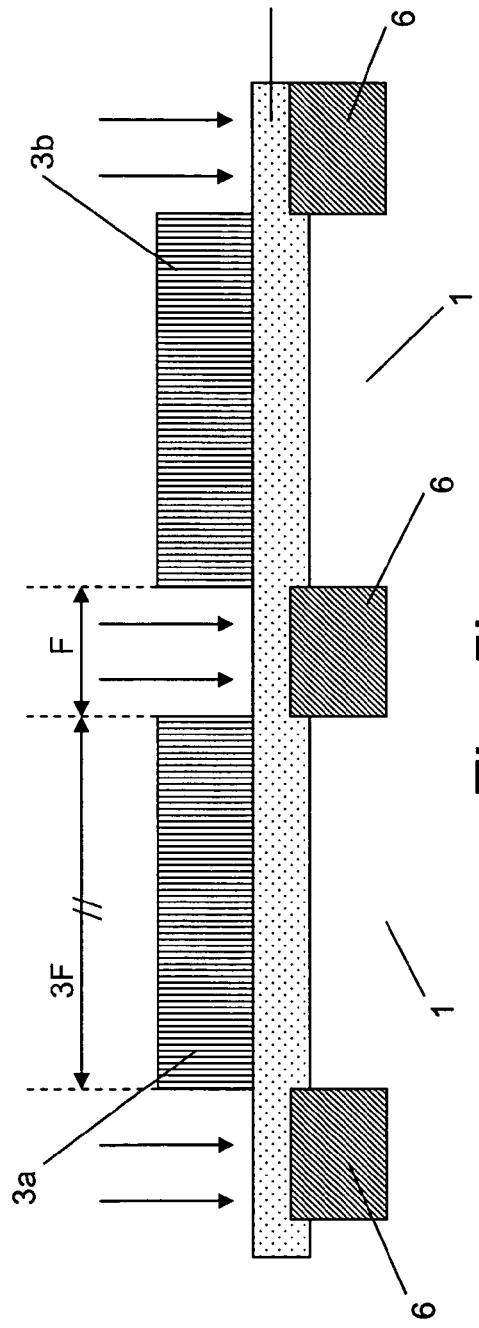
Fig. 5h
Fig. 5i

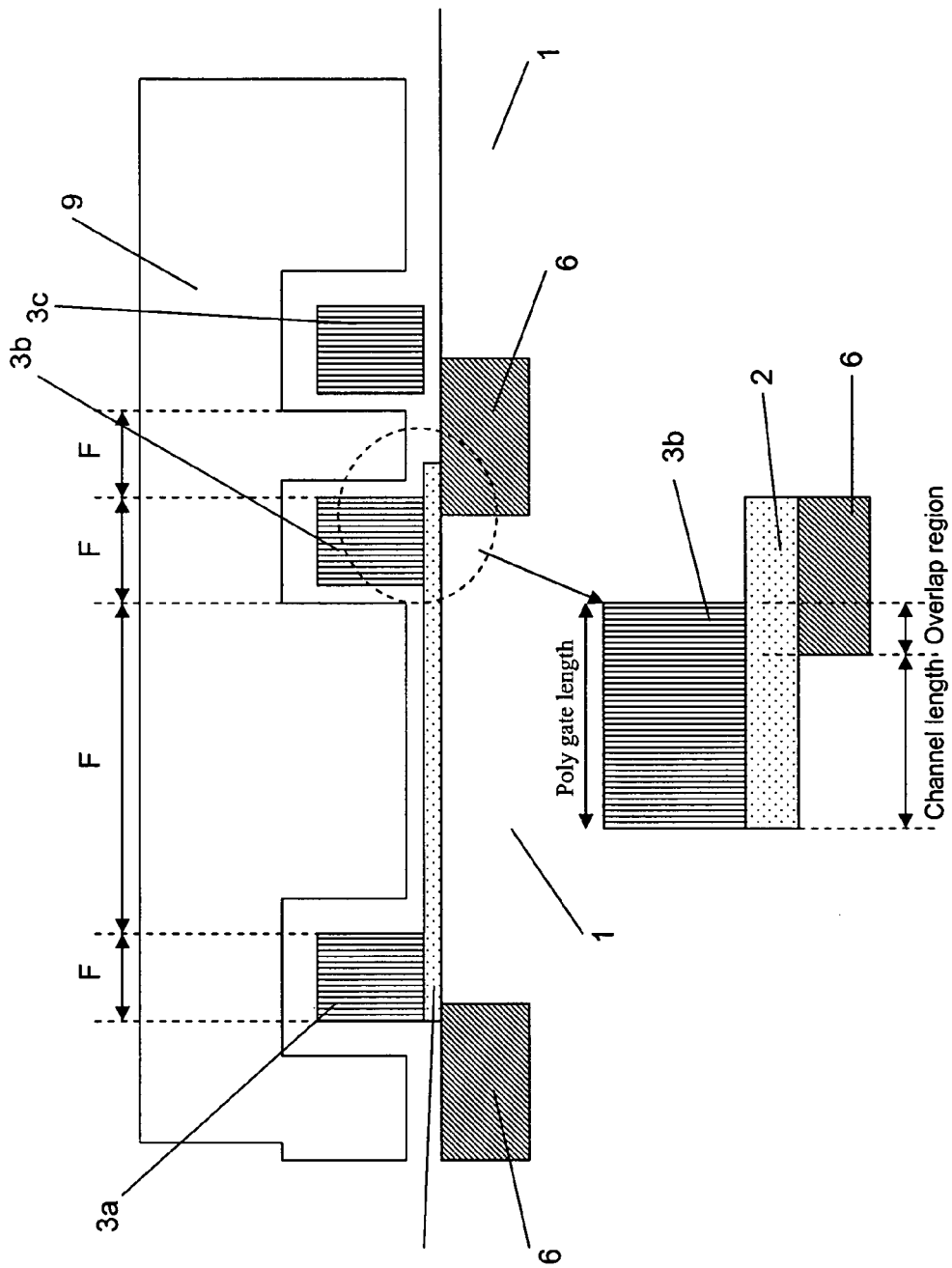

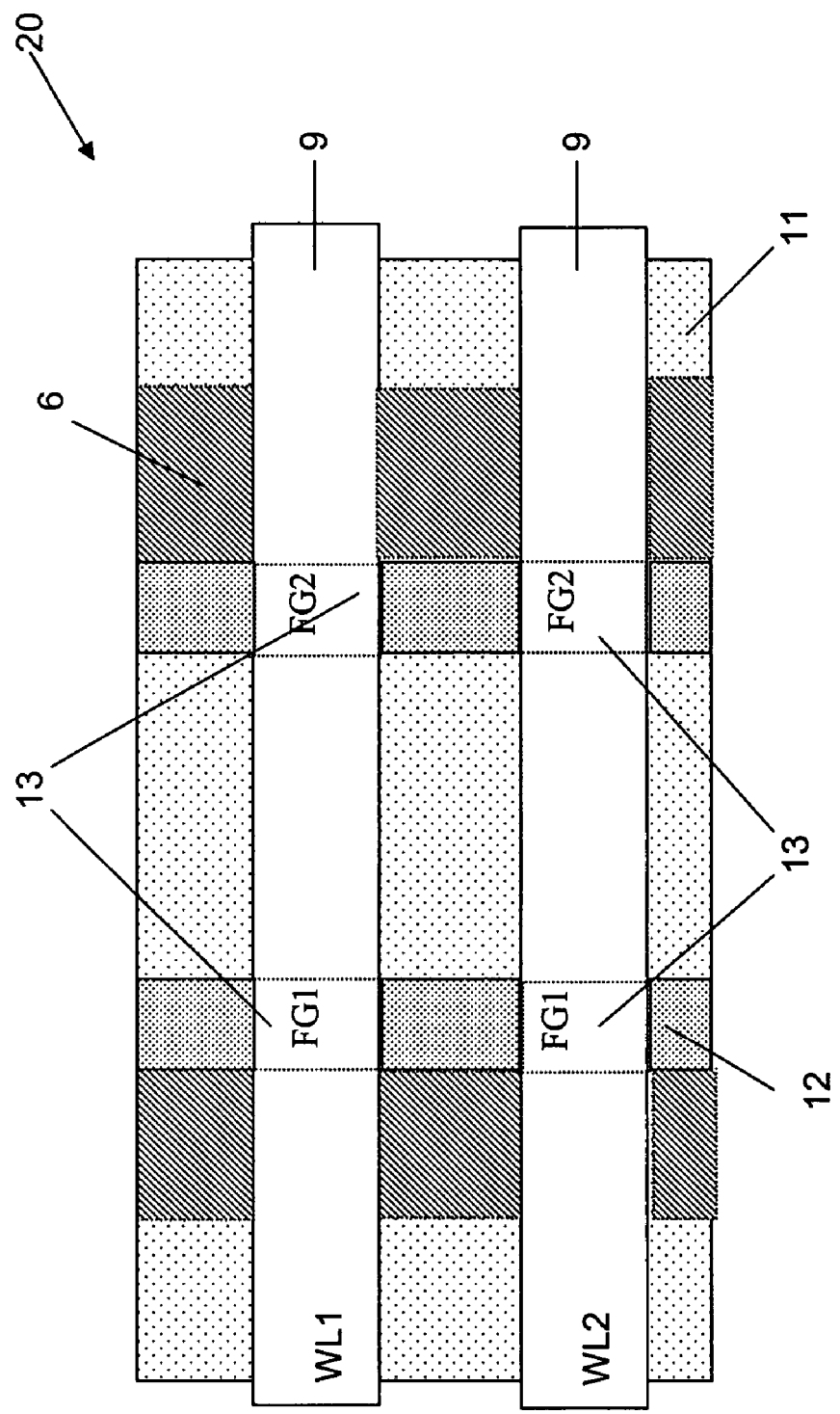

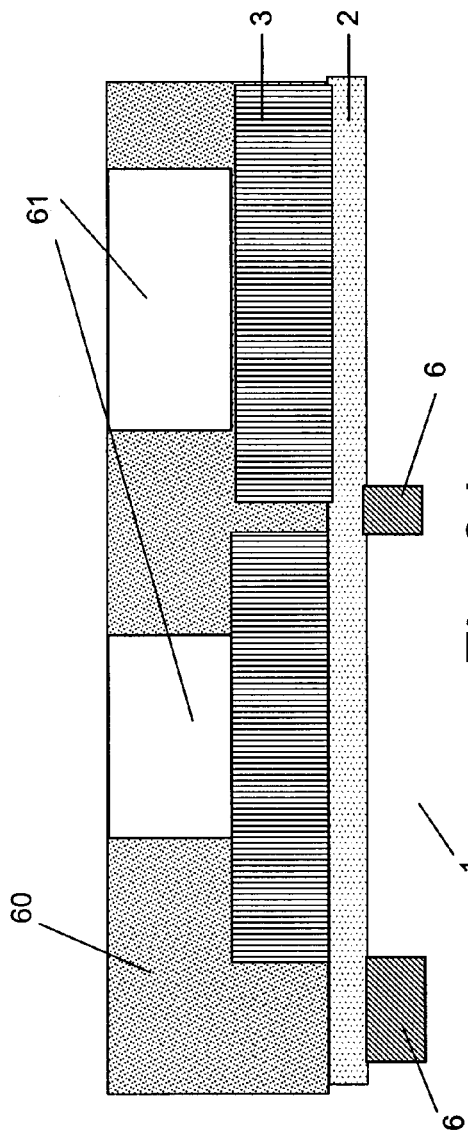
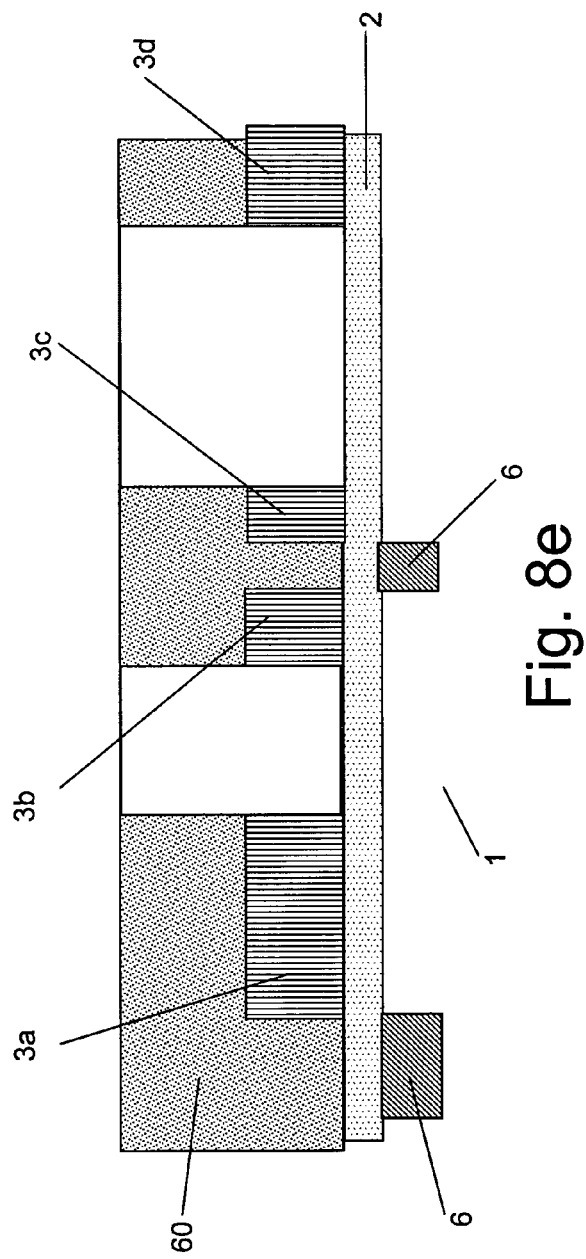

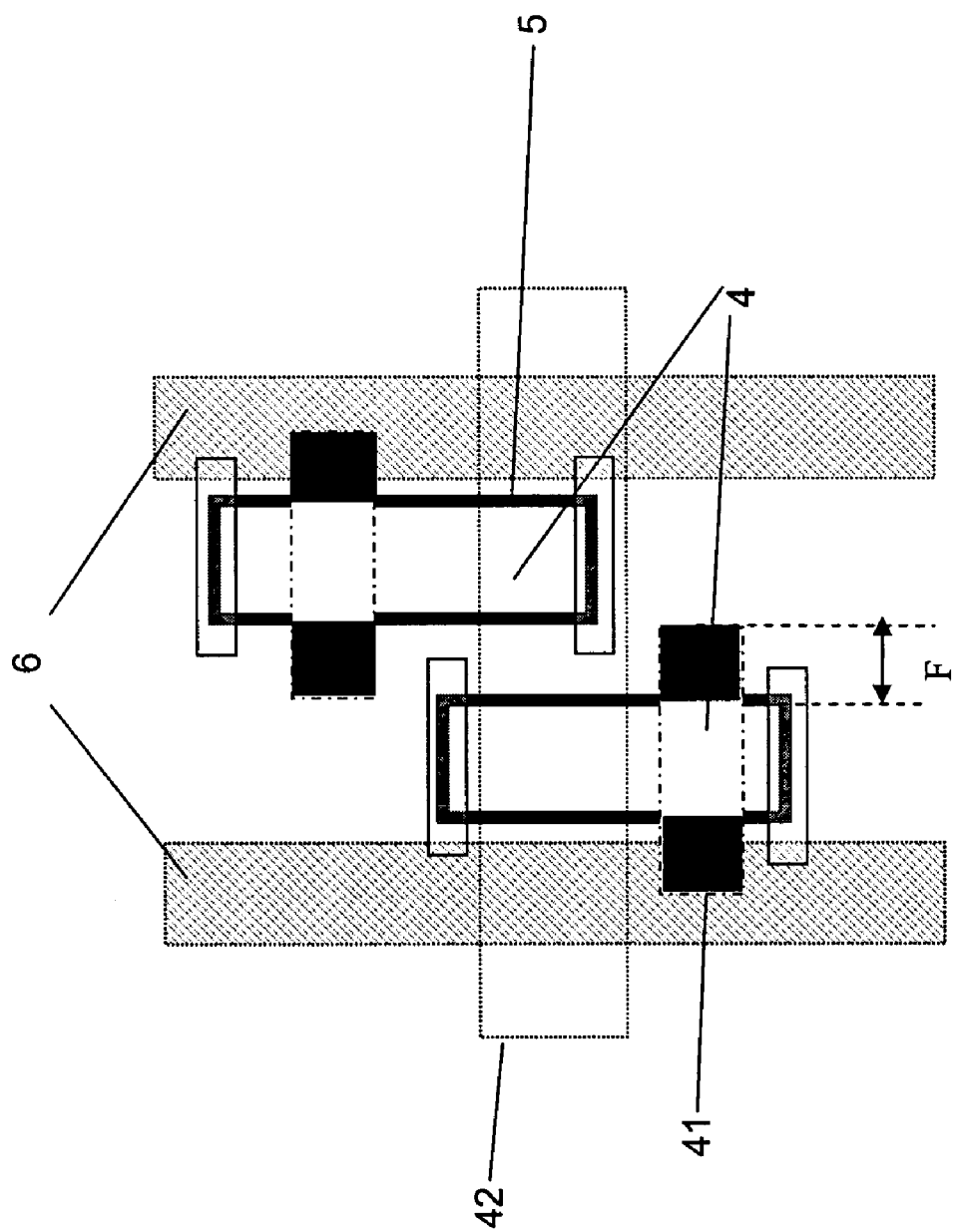

METHOD OF MAKING A MULTIBIT NON-VOLATILE MEMORY

RELATED APPLICATIONS

This application is a divisional of U.S. application Ser. No. 10/603,426, filed Jun. 24, 2003 now U.S. Pat. No. 6,897,517, entitled "MULTIBIT NON-VOLATILE MEMORY AND METHOD", which claims priority to U.S. Provisional Application No. 60/391,565, filed Jun. 24, 2002, and entitled "MULTIPLE BIT NONVOLATILE MEMORY DEVICE AND METHOD FOR FABRICATING THE SAME," both of which are incorporated by reference.

This application hereby incorporates by reference the following U.S. Patents in their entirety;

U.S. Pat. No. 4,794,565, issued Dec. 27, 1988, entitled "Electrically programmable memory device employing source side injection";

U.S. Pat. No. 5,278,439, issued Jan. 11, 1994, entitled "Self-aligned dual-bit split gate (DSG) flash eeprom cell";

U.S. Pat. No. 5,280,446, issued Jan. 18, 1994, entitled "Flash eprom memory circuit having source side programming";

U.S. Pat. No. 5,284,784, issued Feb. 8, 1994, entitled "Buried bit-line source-side injection flash memory cell";

U.S. Pat. No. 5,338,952, issued Aug. 16, 1994, entitled "Non-volatile memory";

U.S. Pat. No. 5,394,360, issued Feb. 28, 1995, entitled "Non-volatile large capacity high speed memory with electron injection from a source into a floating gate";

U.S. Pat. No. 5,583,810, issued Dec. 10, 1996, entitled "Method for programming a semiconductor memory device";

U.S. Pat. No. 5,583,811, issued Dec. 10, 1996, entitled "Transistor structure for erasable and programmable semiconductor memory devices";

U.S. Pat. No. 5,841,697, issued on Nov. 24, 1998, entitled "Contactless array configuration for semiconductor memories";

U.S. Pat. No. 6,044,015, issued on Mar. 28, 2000, entitled "Method of programming a flash EEPROM memory cell array optimized for low power consumption";

U.S. Pat. No. 6,366,500 B1, issued on Apr. 2, 2002, entitled "Process for making and programming and operating dual-bit multi-level ballistic flash memory"; and U.S. Pat. No. 6,580,120, issued on Jun. 17, 2003, entitled "A non-volatile electrically alterable semiconductor memory device and methods of operating such device"; and This application hereby incorporates by reference the following U.S. patent applications in their entirety:

U.S. Provisional Patent Application No. 60/161,275, filed Oct. 25, 1999, entitled "A non-volatile electrically alterable semiconductor memory device and methods of operating such device";

U.S. Provisional Patent Application No. 60/296,618, filed Jun. 8, 2001, entitled "Two bit non-volatile electrically erasable and programmable memory structure, a process for producing said memory structure and methods for programming and erasing said memory structure"; and U.S. application Ser. No. 10/156,427, filed May 28, 2002, entitled "Memory system for multibit storage and method for storing and reading out data in said system".

This application hereby incorporates by reference the following European Patent Applications in their entirety:

European Patent Application No. EP008701458, filed Oct. 25, 2000, entitled "A non-volatile electrically alterable semiconductor memory device and methods of operating such device";

European Patent Application No. 00870245.8, filed Oct. 25, 2000 entitled "Electrically programmable and erasable memory device and method of operating the same", which published as European Publication No. 1096572 A1 on May 2, 2001.

BACKGROUND OF THE INVENTION

1. Field of the Invention

The present invention relates to a multibit non-volatile memory and method and especially to a flash memory and method such as a fast-programmable Flash EEPROM (Electrically Erasable Programmable Read-Only Memory) device relying on hot-electron injection for programming which is particularly suited for high density low-voltage low-power applications and employs only two polysilicon layers.

2. Description of Related Art

Most Flash memories use Channel Hot Electron Injection (CHEI) at the drain side of the memory cell or Fowler-Nordheim Tunnelling (FNT) for programming. On the one hand the CHEI mechanism provides a relatively high programming speed (~10 µs) at the expense of a high power consumption (~400 µA/bit) which limits the number of cells that can be programmed simultaneously (so-called page-mode programming) at the moment to a maximum of 8 bytes (Y. Miyawaki et al., IEEE J. Solid-State Circuits, vol. 27, p. 583, 1992. Furthermore, in order to allow a further scaling of the transistor dimensions towards 0.18 µm and below, supply voltage scaling from 3.3V towards1.8V also becomes mandatory. This supply voltage scaling is known to degrade the CHEI efficiency—and hence the corresponding programming speed—considerably. Today, these memories already use a bitline charge pump to provide a 4–5V drain voltage to the cell during programming and erasing. The problem with this solution is two-fold:

Since the internally generated programming voltages are not scaled down with respect to the technology generation, it becomes practically impossible to further scale the cell itself, in terms of both vertical (i.e. dielectric thickness) and lateral (i.e. gate length) dimensions;

Due to the high power needed to trigger the CHEI it becomes harder and harder to generate these voltages on-chip from a high voltage generator or charge pumping circuit. Also, the relative area of the charge pumps and the corresponding high-voltage switching circuitry increases with respect to the useful area of the memory chip.

The Fowler Nordheim tunnelling (FNT) on the other hand provides slower programming times (~100 µs) and a lower power consumption which allows larger pages (~4 kbit) in order to reduce the effective programming time to 1 µs/byte (T. Tanaka et al., IEEE J. Solid-State Circuits, vol. 29, p. 1366, 1994). Further improvement is, however, limited by tunnel-oxide scaling limits and by the very high voltages (~15V) needed on chip for FNT, both compromising device reliability and process scalability.

The recent success of Source-Side Injection (SSI) as a viable alternative for programming over FNT and CHEI for Flash programming, is mainly due to its unique combination of moderate-to-low power consumption with very high programming speed at moderate voltages. Source-Side Injection has very high efficiency in generating hot electrons in the channel. It also provides very high efficiency in collecting the channel hot electrons onto the floating gate. SSI programming improves reliability and allows for re-programming using on-chip charge pumps. A typical example of such a device relying on SSI for programming is the Applicant's High Injection Metal-Oxide-Semiconductor or HIMOS® (an IMEC registered trademark) memory cell (J. Van Houdt et al., 11$^{th}$ IEEE Non-volatile Semiconductor Memory Workshop, February 1991; J. Van Houdt et al., IEEE Trans. Electron Devices, vol. ED-40, p. 2255, 1993). As also described in the U.S. Pat. Nos. 5,583,810 and 5,583,811, a speed-optimised implementation of the HIMOS® cell in a 0.7-μm CMOS technology exhibits a 400 nanoseconds programming time while consuming only a moderate current (~35 μA/cell) from a 5V supply. This result is obtained when biasing the device at the maximum gate current, i.e. at a control-gate voltage ($V_{cg}$) of 1.5V. In terms of the feature size F (i.e. the smallest dimension on chip for a given technology), the HIMOS® cell area corresponds to ~30F$^2$. This is fairly large as compared to the high density Flash memory concepts which are all in the <10F$^2$ range.

However, due to the growing demand for higher densities, also in embedded memory applications like e.g. smart-cards and embedded microcontrollers, a continuous increase in array density and the scaling of the supply voltage become mandatory. This evolution calls for more aggressive cell-area scaling and for low-voltage and low-power operation.

There have been many attempts to solve this problem by the fabrication of high-density high-performance Flash memory device using 3 polysilicon layers. However, the solutions found suffer from a number of significant disadvantages that will be discussed below in more detail.

U.S. Pat. No. 5,284,784 by Manley and U.S. Pat. No. 4,794,565 by Wu describe so-called "sidewall gate" devices. The floating gate FG is formed in the first polysilicon layer, while the select gate is formed by a polysilicon sidewall spacer. This spacer can be formed in the second polysilicon layer (Manley, FIG. 1) or in the third one (Wu, FIG. 2). The programming mechanism is source-side hot-electron injection. Next to the triple poly process, this solution has a lot of disadvantages:

The sidewall select gate is formed by depositing a polysilicon layer on the chip which is then partially removed selectively by using anisotropic (dry) techniques. It is, however, very difficult to control this selective etching operation, as for example the width of the spacer remaining after etching determines the effective channel length during programming and this parameter should be tightly controlled. Furthermore, the effective channel length is also influenced by the junction implant when going through the thinner portion of the spacer.

Since the select gate controls only a short portion of the channel, it is not straightforward to switch off the transistor channel in some cases, e.g. when reading/writing a particular cell the select gates of the (erased) cells sharing the same bitline have to be able to reduce their channel current to zero in order to prevent leakage currents and/or unwanted programming in the array. Usually, the thickness of the polysilicon, which determines the width of the spacer, is smaller than the minimum feature size, which compromises the hard-off situation, which is highly desired in a memory array.

It is well known that the efficiency of the SSI mechanism is closely linked to the thickness of the oxide spacing in between the select and the floating gate (see e.g. J. Van Houdt et al., IEEE Transactions on Electron Devices, vol. 39, no. 5, May 1992). By putting the sidewall select gate right next to the control gate (CG) (FIG. 2), this oxide spacing has to remain fairly thick since it also has to isolate the high control gate voltage during programming form this sidewall select gate. Therefore, the injection efficiency is compromised by isolation requirements.

The main problem with these devices, however, is the difficulty of contacting the cells in a large array of memory cells. Indeed, the sidewall gate is also used for wiring and this has a considerable negative impact on the parasitic resistance in a large memory array, as explained in U.S. Pat. No. 5,394,360, issued Feb. 28$^{th}$, 1995, to T. Fukumoto (col. 1 lines 37–41). Also, variations in sheet resistance, due to variations in spacer profile and/or doping, can lead to poor cell uniformity in large arrays which typically shows up as a severe manufacturability issue.

U.S. Pat. No. 5,338,952, issued Aug. 16, 1994, to Y. Yamauchi, solves some of the problems mentioned above by forming the floating gate as a polysilicon sidewall spacer (FIG. 3). However, the major drawbacks of the sidewall gate device are still present in the memory cell described in this patent;

The sidewall gate is still formed by depositing a polysilicon layer on the chip which is then removed selectively by using anisotropic (dry) etching. In this case, the width of the spacer remaining after etching determines the effective channel length during read-out and this parameter should be tightly controlled. Indeed, if electrons are stored on the floating sidewall gate, the portion of the channel controlled by this sidewall has to be switched off efficiently, which is not trivial. As already mentioned above, the thickness of the polysilicon, which determines the width of the spacer, is usually smaller than the minimum feature size, which compromises the hard-off situation which is highly desired in a memory array. Eventually, the cell may exhibit a soft-on and a hard-on state instead of hard-off/hard-on states as required for fast access. Furthermore, since erasing is now to be achieved from the sidewall towards a sufficiently underdiffused drain junction, the effective channel controlled by the spacer is even smaller. This makes the leakage problem during read-out even more critical.

Since the floating gate is a sidewall spacer, the coupling ration between the control gate (3$^{rd}$ polysilicon layer) and this floating gate will be rather small. This increases the necessary program/erase voltages, which is typically 12V for programming and −11V for erasing as mentioned in the corresponding conference paper "A 5V-only virtual ground Flash cell with an auxiliary gate for high density and high speed applications" by Y. Yamauchi et al., IEDM Tech. Dig., p. 319, 1991.

An alternative memory cell with 3 polysilicon layers, which also uses the source-side injection mechanism similar to the applicant's HIMOS® cell, is disclosed in U.S. Pat. No. 5,280,446. The major difference with the above discussed prior art is the absence of a sidewall gate. Instead, first and second polysilicon layers are etched in a stacked way and the select gate is added on top by a 3$^{rd}$ polysilicon layer. Also this method has some major disadvantages:

It is known to one skilled in the art that such a processing scheme introduces considerable complexity which makes it difficult to use in an embedded memory application.

On the other hand, the used erase voltage is still −12V provided that the bitline is biased at 5V. In future generations, when the supply voltage and hence also the bitline voltage go down, aggressive tunnel oxide scaling will be required in order not to have an increase in this negative voltage.

The oxide spacing between the select gate and the control gate has to be kept quite thick because this oxide also serves to isolate the high programming voltage from the select gate in order not to have a soft-erase effect or even oxide breakdown during programming. This restriction compromises scaling—in general—and also—more in particular—decreases the injection efficiency which is directly linked to the thickness of this spacing as explained extensively by J. Van Houdt et al. in IEEE Transactions on Electron Devices, vol. 39, no. 5, May 1992.

In the European patent application EP 008702458, filed Oct. 25, 2000, a double polysilicon memory cell structure is described. This cell structure still enables to obtain a high performance by the introduction of a novel programming scheme (Drain Enchanced Secondary Injection or DESI). This application shows a compact cell (about $15F^2$) which, however, still suffers from the basic drawbacks of the split-gate structure:

The split gate structure suffers from an inherent misalignment problem, since the second poly (control gate) is always slightly misaligned with respect to the first poly (floating gate). This misalignment does not scale proportionally to the feature size of the technology, and, therefore, introduces larger non-uniformities in programming behaviour and in read current when scaling down. In the case pending European patent application EP 1096572 A1 claiming priority of U.S. pending patent application Ser. No. 09/696,616 also the gate coupling ratio is subject to a misalignment error further increasing the spread on device characteristics. This latter sensitivity can be solved by completely encapsulating the floating gate by the control gate but this is at the expense of cell area and reliability since then the oxide between wordline and bitline needs to withstand the stress of both gate and drain voltages during program/erase conditions.

A second major scaling problem is the requirement of having a separate self-aligned drain junction: the mask for this implant should cover part of the floating gate to make sure that the implant is only present in a self-aligned way at the drain end of the channel and not at the source side of the floating gate.

For example, in 0.18 μm technology, drawing both channels at 0.18 μm dimensions could be marginal if misalignments are not well controlled to values well below 70 nm (3*standard deviation □), and even then, the current drawn from the cell would vary by more than a factor of two from lot to lot. Starting from 0.13 μm technology, it becomes clear that both channels will need to remain longer than the feature size which implies not scaling the lateral dimensions any further.

As explained above, poly spacer technology, as a self-aligned process, has been extensively tried out in order to circumvent these problems, however, without any commercial success so far.

Another solution to obtain self-aligned structures is the so-called dual bit approach, which is described in U.S. Pat. No. 5,278,439, issued on Jan. 11, 1994 to Y. Y. Ma et al. in which the device is a triple poly floating gate version and in the paper "Twin MONOS cell with dual control gates" by Hayashi et al. (Halo and New Halo), presented at the 2000 VLSI Technology Symposium, which describes a nitride charge trapping version. However, both structures suffer from major drawbacks:

When using a triple poly layer approach (U.S. Pat. No. 5,278,439), the device suffers from the same drawbacks as the related U.S. Pat. No. 5,280,446, which has already been discussed above. Only the misalignment issue is resolved at the expense of very complicated processing.

When using a poly spacer technology as in the Halo device, the device suffers from all major problems related to poly spacers as discussed above (U.S. Pat. No. 5,338,952). Some additional drawbacks of such a spacer technology are for example poor interconnect properties causing yield and manufacturability problems (spacer uniformity in terms of shape, width, thickness, doping, . . . ) and variations in the effective channel length beneath the spacer because of the drain junction implant going through the thinner portion of the spacer. This will affect the device performance considerably unless the thickness of the polysilicon layer is constant over the entire channel area. Also, the spacer is only 80 nm wide in a 0.25 μm technology and can, therefore, not easily be controlled. Finally, the spacer process puts a lower limit on the $1^{st}$ poly thickness, because the spacer width is related to this parameter. This is an additional boundary condition for the cell geometry.

Moreover, in the Halo case, the wordline is used to form the spacers which implies that a contact is required either on both source and drain, or, alternatively, on every control gate, in order to have a wordline perpendicular to the bitlines of the memory array. This considerably increases the real bit size when implemented in a true memory array. Considering that the minimum size for a single cell as mentioned in the paper is already $3F^2$, this cell is considerably larger than the one of the present invention. The problem can be resolved by routing the $2^{nd}$ layer of polysilicon over the spacers in horizontal direction (see U.S. patent application No. 20020005545, F. Widdershoven and J. Schmitz). The problem with this configuration is that the spacing between both spacers then needs to be defined from an additional sacrificial layer. Removal of this layer after spacer formation will inevitably attack an oxide-nitride-oxide or ONO layer under the poly spacers exactly at the source-side injection point. This is detrimental for device performance and reliability. Alternatively, a triple poly process could also fulfill the same array connectivity requirements (see U.S. Pat. No. 6,366,500 issued Apr. $2^{nd}$ 2002 by Ogura et al.), however at the expense of a complicated and therefore expensive process.

With respect to the previously discussed prior art, as far as it is known, neither poly spacer technologies, nor the dual bit triple poly layer approach mentioned above, have made it into production because of major manufacturability and yield problems, related either to the spacer itself, and/or to the third poly layer.

SUMMARY OF CERTAIN INVENTIVE ASPECTS

One inventive aspect is to provide a fast-programmable Flash EEPROM (Electrically Erasable Programmable Read-Only Memory) device relying on hot-electron injection for programming which is particularly suited for high density low-voltage low-power applications.

In one embodiment, the invention provides a method of forming a multi-bit non-volatile memory is described. The method comprises depositing a first polysilicon layer on a semiconductor substrate of a first conductivity type, and depositing and patterning a first hardmask layer to form at least a first hardmask region upon said first polysilicon layer. The method further comprises depositing and anisotropically etching a second hardmask layer forming second hardmask spacers adjacent to said at least a first hardmask region. The exposed parts of said first polysilicon layer are selectively removed. The method further comprises removing said at least first hardmask region to expose the first polysilicon layer underneath said at least first hardmask region. The method further comprises removing the exposed parts of said first polysilicon layer underneath said at least first hardmask region to form first and second polysilicon gates having a uniform thickness, one on each side of said at least first hardmask region. The method further comprises removing said second hardmask spacers and exposing said first and second polysilicon gate. The method further comprises depositing and patterning a second polysilicon layer perpendicular to said first and second polysilicon gate to form a third polysilicon gate separating said first and said second polysilicon gate.

In another embodiment, the invention provides a method of forming a multibit non-volatile memory cell structure, comprising providing a semiconductor substrate of a first conductivity type. The method further comprises depositing a first polysilicon layer upon the semiconductor substrate, depositing and patterning a first hardmask layer to form at least one first hardmask region upon the first polysilicon layer. The method further comprises depositing a second polysilicon hardmask layer. The method further comprises forming at one end of the at least one first hardmask region a resist region overlapping the at least one first hardmask region, the overlap defining a contact pad area in the first polysilicon layer. The method further comprises anisotropically etching the second hardmask layer forming second hardmask spacers adjacent the at least one first hardmask region and an region at the end of the at least one first hardmask region. The method further comprises removing the resist region, removing the exposed parts of the first polysilicon layer simultaneously with the second hardmask spacers and overlap region selective to the at least one first hardmask region. The method further comprises depositing a planarizing dielectric and polishing the planarizing dielectric using the first hardmask region as polish stop layer. The method further comprises removing the at least one first hardmask region to thereby form a cavity in the planarizing dielectric and to expose the first polysilicon layer underneath the at least one first hardmask region. The method further comprises removing the exposed parts of the first polysilicon layer underneath the at least one first hardmask region to form a first and a second polysilicon gate having a uniform thickness, one on each side of the at least one first hardmask region. The method further comprises depositing, at least in the cavity, and patterning a second polysilicon layer to form a third polysilicon gate separating the first and the second polysilicon gate.

BRIEF DESCRIPTION OF THE DRAWINGS

All drawings are intended to illustrate some aspects and embodiments of the present invention. Devices are depicted in a simplified way for reason of clarity. Not all alternatives and options are shown and therefore the invention is not limited to the content of the given drawings. Like numerals are employed to reference like parts in the different figures. Preferred embodiments of the present invention are described herein with reference to the drawings wherein:

FIGS. 5a, 5b, 5c, 5d, 5e, 5f and 5g show schematic cross-sections of a second embodiment of the present invention with typical but exemplary programming voltages for the case of secondary injection into dual floating gates, and an overview of the main processing steps.

FIGS. 5h, 5i, 5j and 5k show schematic cross-sections of an alternative embodiment of the present invention FIG. 5l show a top view of an embodiment of the present invention

FIGS. 8a, 8b, 8c, 8d, 8e and 8f show cross-sections according to a sixth embodiment of the present invention in case second hard mask is patterned to form contact pads FIG. 9 show a top view according to a sixth embodiment of the present invention in case second hard mask is patterned to form contact pads FIG. 10 show a top view of an array of memory cells according to an embodiment of the present invention

DETAILED DESCRIPTION OF CERTAIN INVENTIVE EMBODIMENTS

Figure 1:
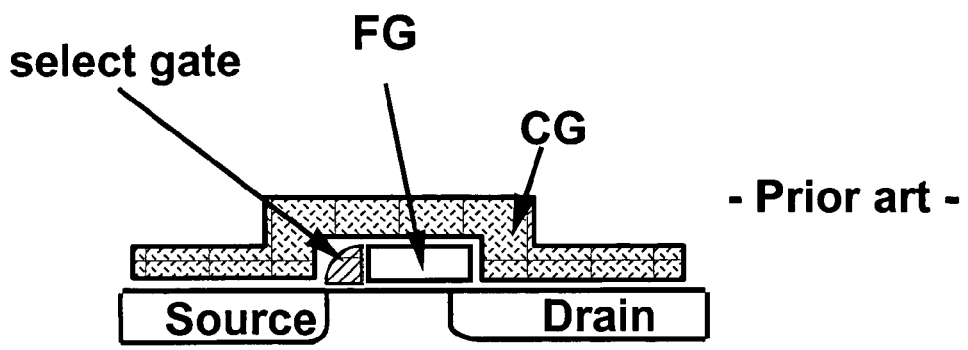
FIGS. 1 and 2 show typical sidewall-gate structures (prior art).
Figure 2:
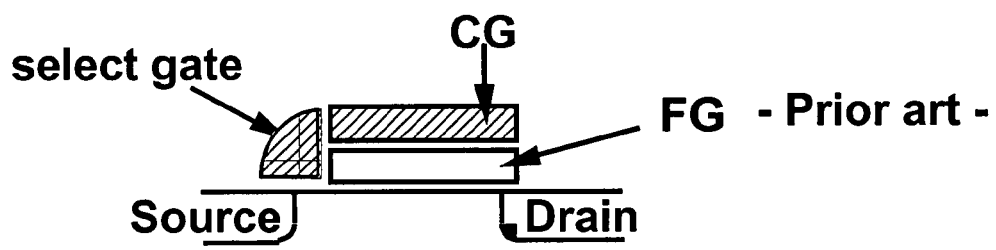
Figure 3:
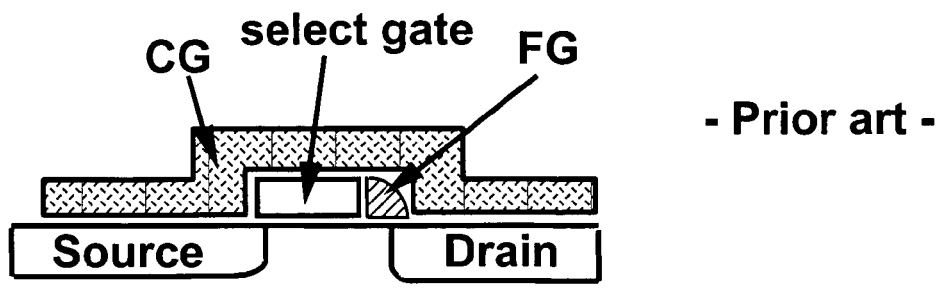
FIG. 3 show an alternative sidewall-gate structure where the sidewall serves as the floating gate (prior art).

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. Where the term "comprising" is used in the present description and claims, it does not exclude other elements or steps.

Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

Moreover, the terms top, bottom, over, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

In a first embodiment of the present invention a double poly (polysilicon) cell is proposed which offers high density without requiring high voltages or complicated processing. The first embodiment of this invention is shown schematically in FIG. 4a. Basically, the floating gates are formed in the first polysilicon layer 3. The control gate CG (equivalently referred to as select gate in some of the referenced applications) and the program gates PG (equivalently referred to as control gate in some of the referenced applications) are formed in the second polysilicon layer 9. Since the source junction is omitted as compared to the original HIMOS® concept, the structure is fully self-aligned in the direction of the transistor channel, i.e. along the wordline WL. The control gate CG channel is shared between two bits of a memory cell. The bits can be programmed selectively because each floating gate in one cell is coupled to a different program gate, which connects to horizontal program lines as explained in U.S. Pat. No. 5,841,697, issued on Nov. 24$^{th}$, 1998.

Figure 4A:
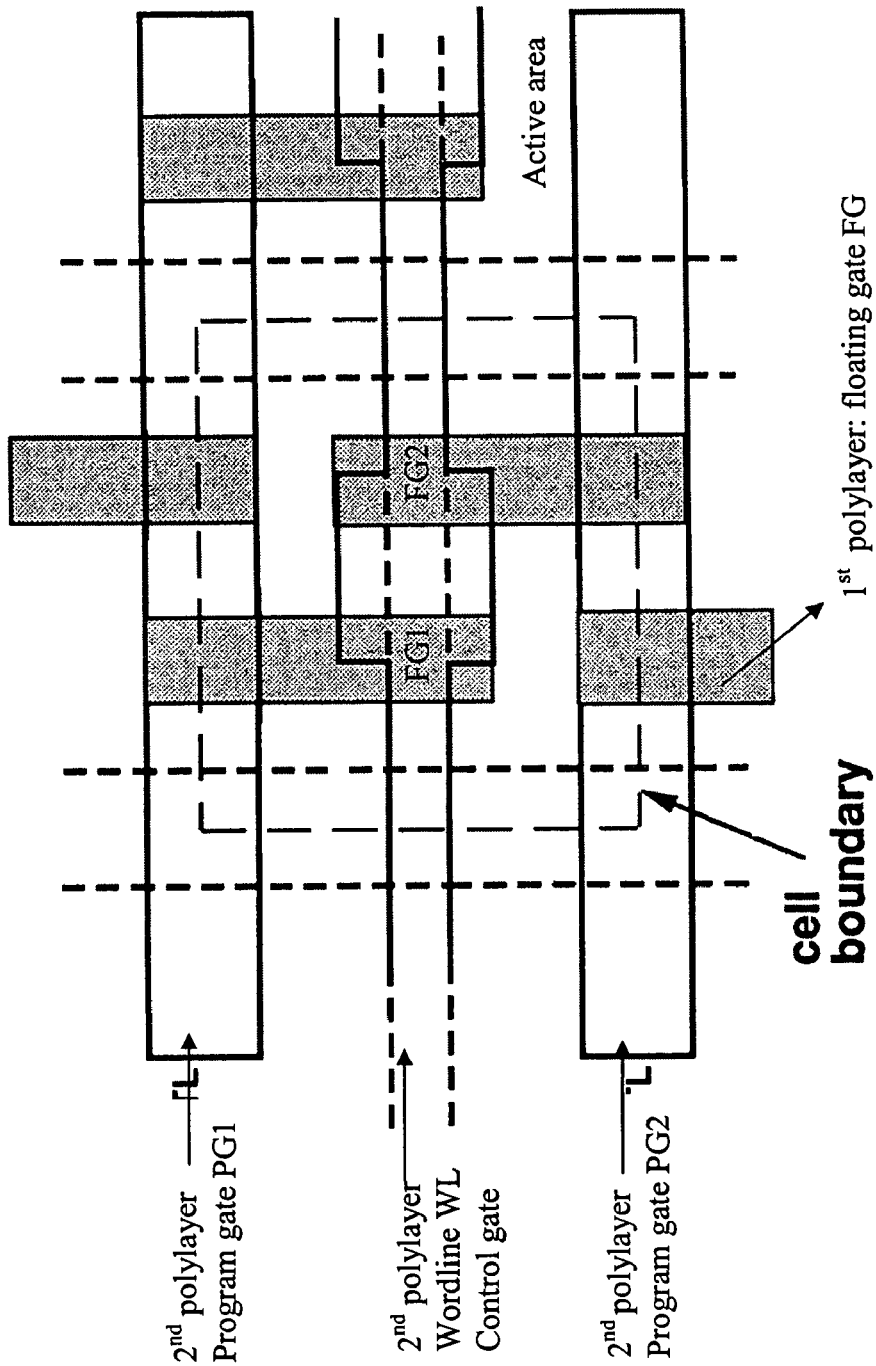
FIGS. 4a and 4b show a schematic layout and array configuration of a first embodiment of the present invention with typical programming voltages for the case of source-side injection into dual floating gates. The indicated cell size is for a 0.7 µm technology.
Figure 4B:
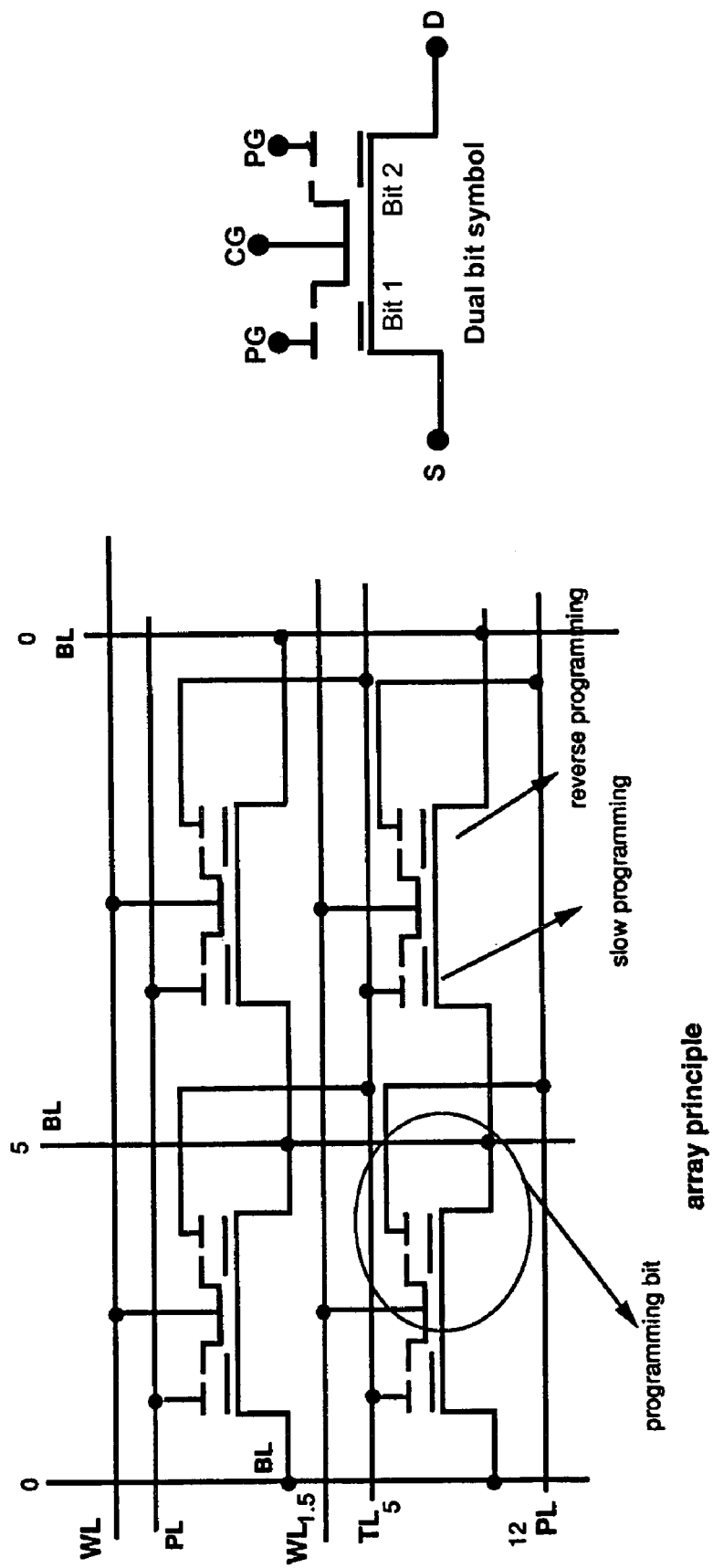

The processing scheme is similar to that used for the conventional HIMOS® case, apart from the omission of the source junction which is now the common region underneath the control gate CG as shown in FIG. 4b top view.

After growing a thin oxide on the substrate (e.g. 80 Å for a 0.35 µm CMOS technology or similar), a first polysilicon layer is deposited and etched to form the floating gates FG of the memory cell. Secondly, a junction is formed by a deep n$^+$ implantation which is self-aligned with respect to the floating gate on the outer sides of the memory cell. Afterwards, a thin oxide (comparable to the CMOS gate oxide of the corresponding generation, e.g. 70 Å for 0.351 µm CMOS or similar) is grown on the complementary part, i.e. the exposed parts of the substrate, and simultaneously a thin polyoxide is formed on the top and the sidewall of the floating gate. Depending on the oxidation conditions and the doping level of the floating gate, this interpoly oxide can be very thin for example 5–15 nm. Alternatively, for example a composite Oxide-Nitride-Oxide (ONO) interpoly layer may be used on top of the floating gate. In this case, such composite interpoly layer should be formed after deposition of the first polysilicon layer and subsequently etched, using the same mask, with the first polysilicon layer when patterning the floating gate. Then, a second polysilicon layer is deposited and etched to form the control gate of the memory cell.

FIG. 4a shows an exemplary layout for the memory cell while FIG. 4b shows an equivalent circuit with typical operating conditions indicated at the wordline (WL), bitline (BL), and program lines (PL) according to the present invention. The full table of operating voltages is given in table 1. The values on the left hand side in each column are to be used in case bit 1 is to be addressed. The values on the right hand side in each column are to be used in case bit 2 is to be addressed.

|  | BL1<br>bit1/bit2 | BL2<br>bit1/bit2 | WL | PL1<br>bit1/bit2 | PL2<br>bit1/bit2 |
| --- | --- | --- | --- | --- | --- |
| program | 3.3/0 | 0/3.3 | 1 | 9/3 | 3/9 |
| read-out | 1/0 | 0/1 | 1.5–1.8 | 0/3 | 3/0 |
| erase | 4 | 4 | −5 | −5 | −5 |

Table 1: exemplary operating voltages for the memory array of FIG. 4b using source-side injection for programming according to a first embodiment.

The device operates in a similar way to that of the HIMOS® devices described in the U.S. Pat. No. 5,583,811, if considering the program line (PL) of the opposing bit, i.e. the bit of the dual bit that is not programmed, as a transfer gate which is merely biased above the threshold-voltage window in order to access the addressed bit regardless of the value of the opposing bit. This explains the value of 3V in the table of operating voltages below: the threshold voltage is typically changed between −2.5V and +1 or 2V for HIMOS® and, therefore, 3V is sufficient in order to turn on the channel which is in series with the addressed bit in both read and write operations.

According to an aspect of the present invention, the problem concerning misalignment on the control gate channel length of the split-gate structure is avoided and the cell can be scaled down to approximately 15F$^2$ (per bit) using the same process. However, there are still some remaining scaling issues. A first issue is the fact that the erase junction implant should be restricted to the outer sides of the floating gates, and therefore, the floating gates can not be scaled proportionally to the feature size (see also prior art section). In the other direction (perpendicular to the channel length direction, i.e. the vertical direction in the layout of FIG. 4a), there are still some misalignment issues, for example the overlap of poly gates on active area and of poly 2 with respect to poly1 is affecting the cell size considerably.

Figure 5A:
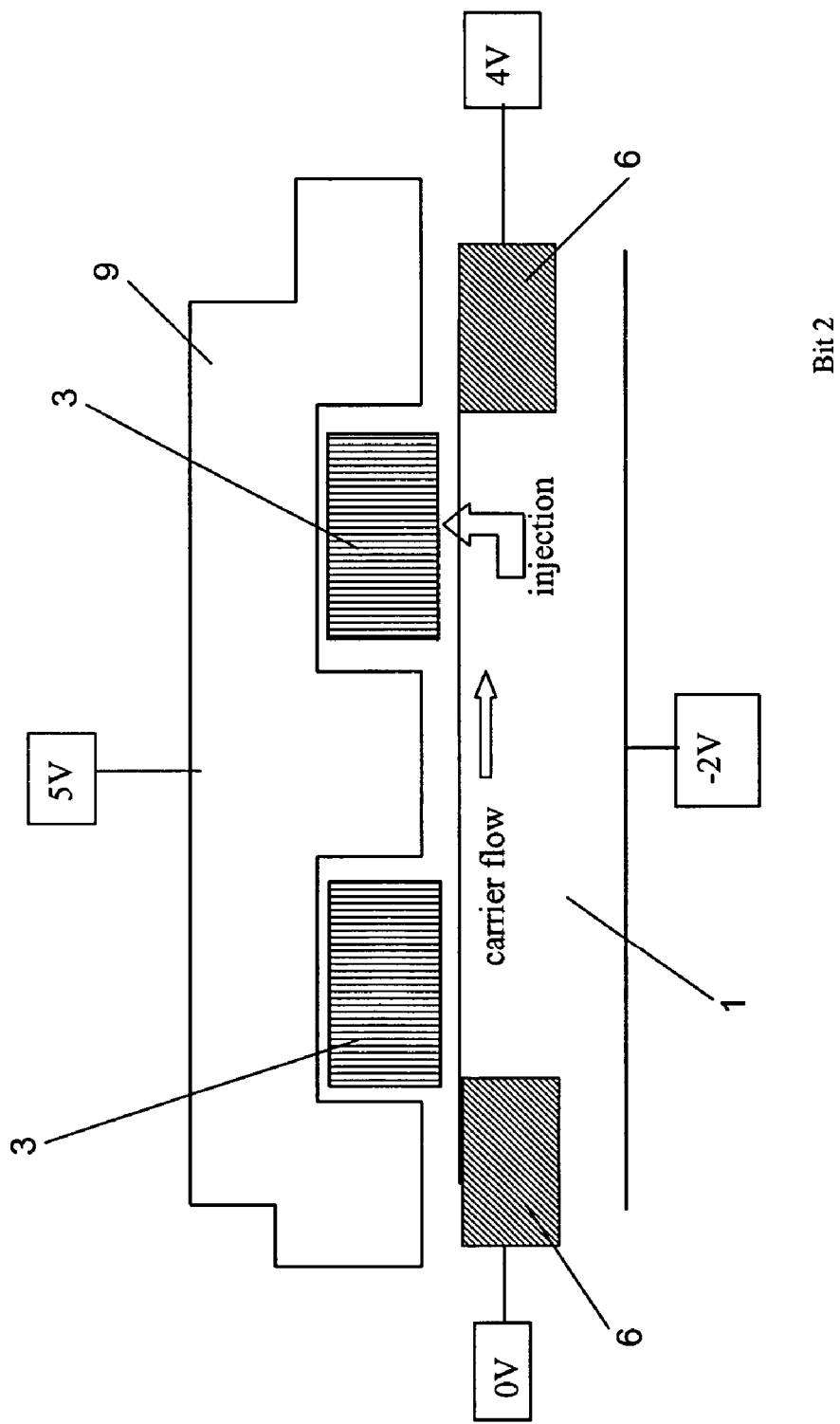

In a second embodiment of the present invention a processing scheme is disclosed which allows a very small device having an area in the order of 2F$^2$ per bit which is completely self-aligned. The second embodiment of the invention is illustrated schematically in FIGS. 5a–g, which show the main elements of the fabrication process for forming a single memory cell according to this embodiment. FIG. 5a shows a cross section of the device according to the present invention. Hereafter, different steps for the formation of a memory cell according to the present invention will be discussed. Other steps may be required in order to complete the process sequence, but these steps are known to a person skilled in the art and hence will not be discussed further. The process comprises the following different subsequent steps.

In a first step, which is illustrated by FIG. 5b gate dielectric formation and gate electrode deposition are performed, together with a first hardmask 4 deposition and etching. After growing a dielectric layer 2, which can for example be an oxide layer or ONO stack, onto the substrate 1. The substrate may, for example, be an n- or p-type silicon wafer but is not limited hereto. A first conductive layer 3, which may be a polysilicon layer, is deposited on top of this dielectric layer 2, optionally followed by forming an oxide-nitride-oxide (ONO) interpoly dielectric (not shown) on this first conductive layer 3.

A first hardmask 4 is then deposited on top of the first conductive layer 3 or on top of the optionally formed interpoly dielectric (not shown). The first hardmask 4 is etched in stripes parallel to the bitline direction, which is perpendicular to the view shown in FIG. 5b. The first hardmask 4 can have a minimal dimension equal to the minimal feature size F, whereas the minimal spacing between the first hardmask 4 lines can also be equal to the minimal feature size F. The first hardmask stripe 4 or region and the spacing in between have preferably the minimum design dimension available in a given lithographic technology or other technology.

In FIG. 5c a second step, comprising deposition of a second hardmask 5 and back etching, followed by self-aligned polyetch, is illustrated. The second hardmask 5 is deposited onto the substrate 1, by but not limited to chemical for example vapour deposition (CVD) or other conformal deposition techniques. This second hardmask layer 5 is etched back in order to create a spacer adjacent to and along the first hardmask stripe 4 as shown in FIG. 5c. The second hardmask 5 preferably consists of a material different than the first hardmask 4 to allow selective anistropic etching of the second hardmask layer 5.

Figure 5D:
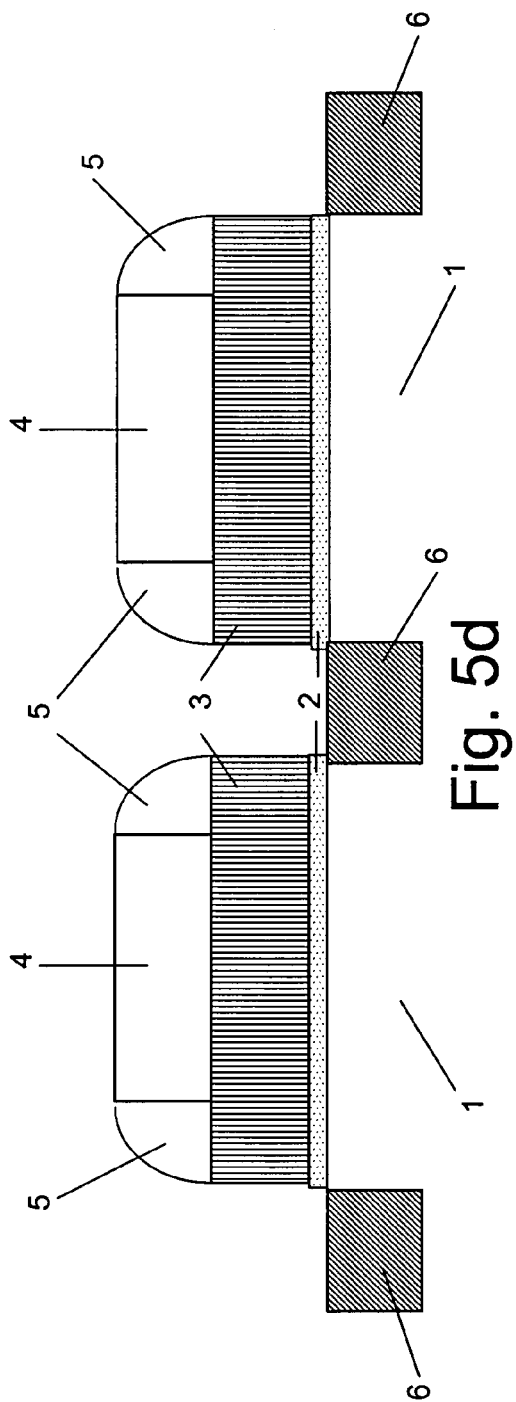

In a next step, illustrated in FIG. 5d, first patterning of the first polysilicon layer 3 is performed in order to outline the memory cell. The exposed part of the first polysilicon layer 3 may be removed. In the exposed area, i.e. outside of the first 4 and second 5 hardmask area, the first polysilicon layer 3 is etched self-aligned to the second hardmask spacer 5. If an interpoly dielectric is present (not shown), this interpoly dielectric will be etched prior to the etching of the first polysilicon layer 3.

Junctions 6 are implanted in the substrate in a self-aligned manner to the patterned first polysilicon layer 3 in order to form the bitlines 6 as shown in FIG. 5d. Further diffusion of the junctions 6 underneath the first polysilicon layer 3 can be obtained by providing the necessary thermal budget. The implanted bitlines 6 are shared between neighbouring memory cells.

Figure 5E:
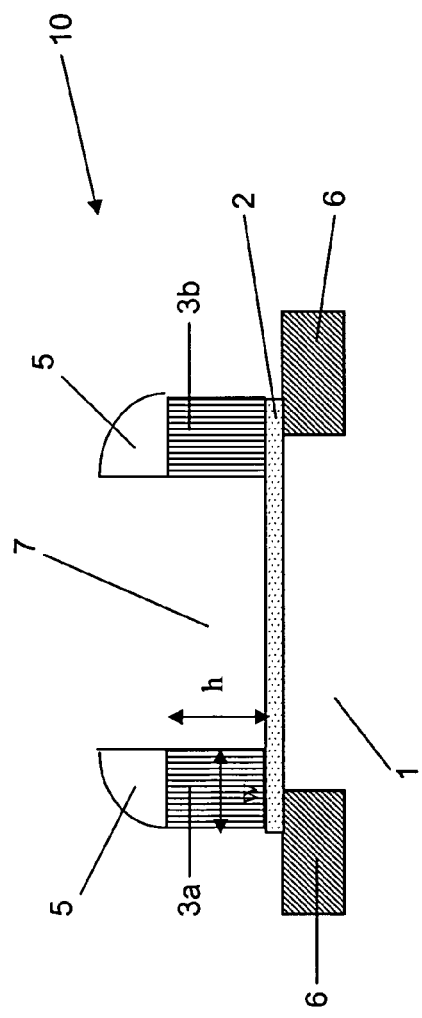

In another subsequent step second pattering of the first polysilicon layer 3 is carried out to form polysilicon stripes 3a–b. The first hardmask stripe 4 is removed selectively with respect to the second hardmask spacers 5 to expose the underlying first polysilicon layer 3. The exposed first polysilicon layer 3 is removed by etching again self-aligned to the spacers formed in the second hard mask 5 to create two floating gates 3-b. This second etch of the first polysilicon layer 3 is performed in order to create two stripes of floating gates 3a–b, which are located one on each side of the memory cell 10 The width dimension (transverse dimension) of the stripes is process defined (not mask defined). This dimension can be sub-lithographic because it is not mask defined. That is the dimension can be below the minimal feature size F of the technology in which the cell is implemented. By sub-lithographic is meant that if a wavelength of light is used for a lithographic step, a sub-lithographic dimension is one that is less than 0.25 of that wavelength if the minimal feature size is limited by lithography or alternatively is defined by being less than the critical dimension or minimal feature size of a part or, the whole of the process, e.g. for 0.35 micron processing technology, a sub-lithographic dimension is less than 0.35 micron. The minimal feature size of a technology is given by the technology roadmap of International Technology Roadmap for Semiconductors (ITRS) defined by the Semiconductor Industry Association (SIA)-see http://www.public-.ITRS.net. The width of the second hardmask spacers 5 defines the width of the two floating gates 3a–b. The thickness h of the floating gates 3a–b is equal to the thickness of the as-deposited first polysilicon layer 3 and remains substantially uniform along the width w of the floating gates 3a–b as shown in FIG. 5e. By etching the first polysilicon layer 3, a cavity 7 is created for receiving the second poly layer in which the wordline will be formed. This cavity 7 will define the channel region of the control gate or wordline formed in the second polysilicon layer 9.

The present invention allows formation of a floating gate 3a–b with dimensions below the minimal feature size F of the technology, but with a constant thickness, e.g. a rectangular cross-section. Only the width w of the floating gates 3a–b depends on the thickness of the second hardmask layer 5, the thickness of the first hardmask stripe 4 and on the spacer-etch time. The spacer-defined gate has a rectangular cross-section. The present invention thus allows to independently control the width and the height of the floating gates 3a–b.

Figure 5F:
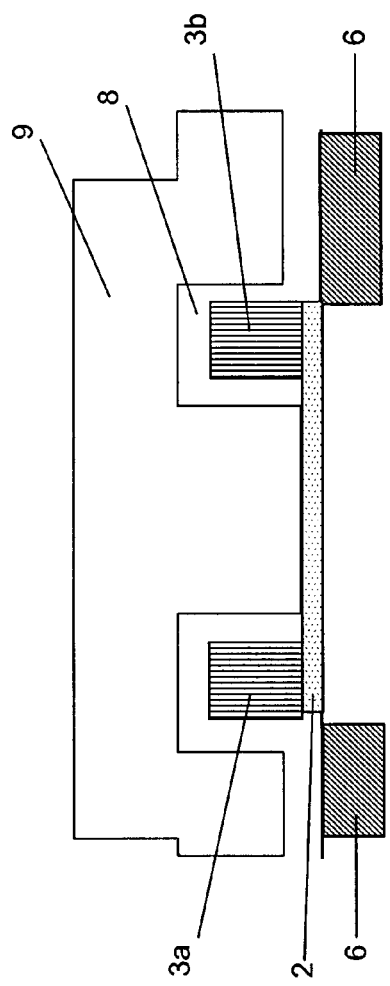

In a next step the spacers formed in the second hardmask layer 5 are removed. This is illustrated in FIG. 5f. If the second hardmask 5 is for example a polysilicon layer the removal of the this second hardmask 5 could be combined with the patterning of the floating gate 3 during the second poly etch in the foregoing step, but then an etch stop layer (not shown in the figure) must be present on top of the first polysilicon layer 3. An example of an etch stop layer is an oxide layer which might be formed on the first polysilicon layer 3 prior to the deposition of the first hardmask 4.

If no interpoly dielectric is formed prior to the first etching of the first polysilicon layer 3, the interpoly dielectric layer, e.g. oxide, is now formed. The interpoly dielectric may for example be an oxide, but is not limited hereto. The polysilicon layer is exposed by e.g. wet etching any remaining layers, and then an interpoly dielectric layer 8 is grown covering the floating gates 3a–b and the substrate 1.

Subsequently a second polysilicon layer 9 is deposited on top of the interpoly dielectric 8 covering the floating gate stripes 3a–b. This second poly layer 9 is patterned as shown in FIG. 5f, to form the wordline 9 of the dual-bit floating gate structure in a fully self-aligned manner substantially parallel to the bitlines 6.

After etching the second polysilicon layer 9 to form the wordlines in a direction perpendicular to the bitlines 6, yielding parallel lines of second poly material 9, the stripes of floating gates 3 have to be separated between the different cells along a bitline 6 to yield the individual floating gates 3a–b. This separation is done by extending the poly etching of the second polysilicon layer 9 to also remove this first polysilicon layer 3 not covered by the patterned second polysilicon layer 9, i.e. the wordlines 9. This stacked poly-etch defines the wordline 9 all the way down to the substrate 1. Hence the depth of the floating gates 3a–b, i.e. the dimension perpendicular to the view in FIG. 5f, is defined self-aligned to the wordline 9 and is equal to the width of the wordline 9.

A last step results in isolation of the memory cells 10. The array is finalized by providing a $p^+$ implant (not shown) in the exposed substrate in between the wordlines 9 for electrically isolating the individual cells 10 realizing a fieldless isolation area between these wordlines 9. This isolation step is very well known in the state-of-the-art and has been used already in EPROM's in the 80's, see Esquivel et al., "High density contactless, self aligned EPROM cell array technology", IEDM Tech. Dig., 1986, p. 592.

Figure 5G:
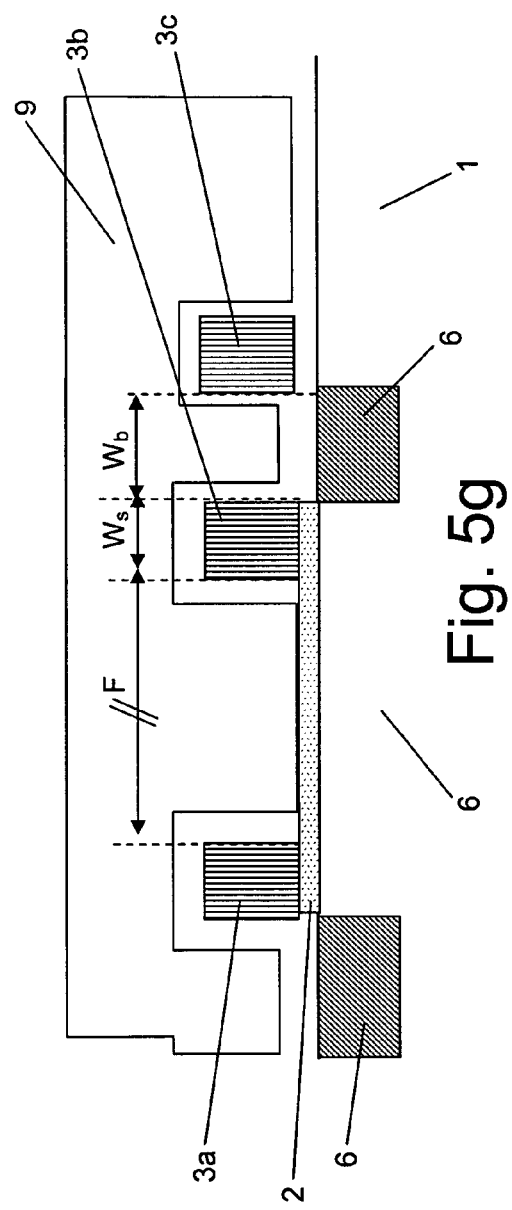

The bit size of the memory cell 10 formed according to this embodiment of the present invention is $(F/2+t_{sp}+W_{BL}/2)*2F$ with F the feature size of the considered memory technology, $t_{sp}$ the spacer width| (which depends on the thickness of the second hardmask layer 5, the thickness of the first hardmask layer 4 and on the spacer overetch time) and $W_B$ the width of the bitline 6 as defined by the spacing between 2 PG's 3a–b of adjacent memory cells, as illustrated in FIG. 5g. When only considering lithographic restrictions, the following lower limit applies to the horizontal dimensions in FIG. 5g: $2t_{sp}+W_B \geq F$ since the spacing between 2 consecutive first hardmask stripes 4 along a wordline 9 should be at least equal to the feature size. Since the spacers 5 can be sub-lithographic, and the bitline 6 implant is fully self-aligned, it is possible to fabricate the structure with e.g. $t_{sp}=F/4$ and $W_B=F/2$ which only doubles the resistance of the bitline 6 with respect to the (conventional) contactless array with $W_B=F$. This yields a theoretical minimum bit size of $2F^2$/bit.

In another embodiment of the present invention an alternative to the method of the second embodiment is illustrated by FIGS. 5h–l. In the former embodiment, the width of the gate formed in the first polysilicon layer 3 is determined by the width of the spacer 5 formed in the second hardmask 5. As outlined above, this spacer 5 width is not determined by the lithographic process used, but is a function of layer thickness and etch processes. As illustrated in FIG. 5e the junction constituting the bitline 6 is then formed selfaligned to this floating gate 3a–b formed in the first polysilicon layer 3.

Figure 5J:
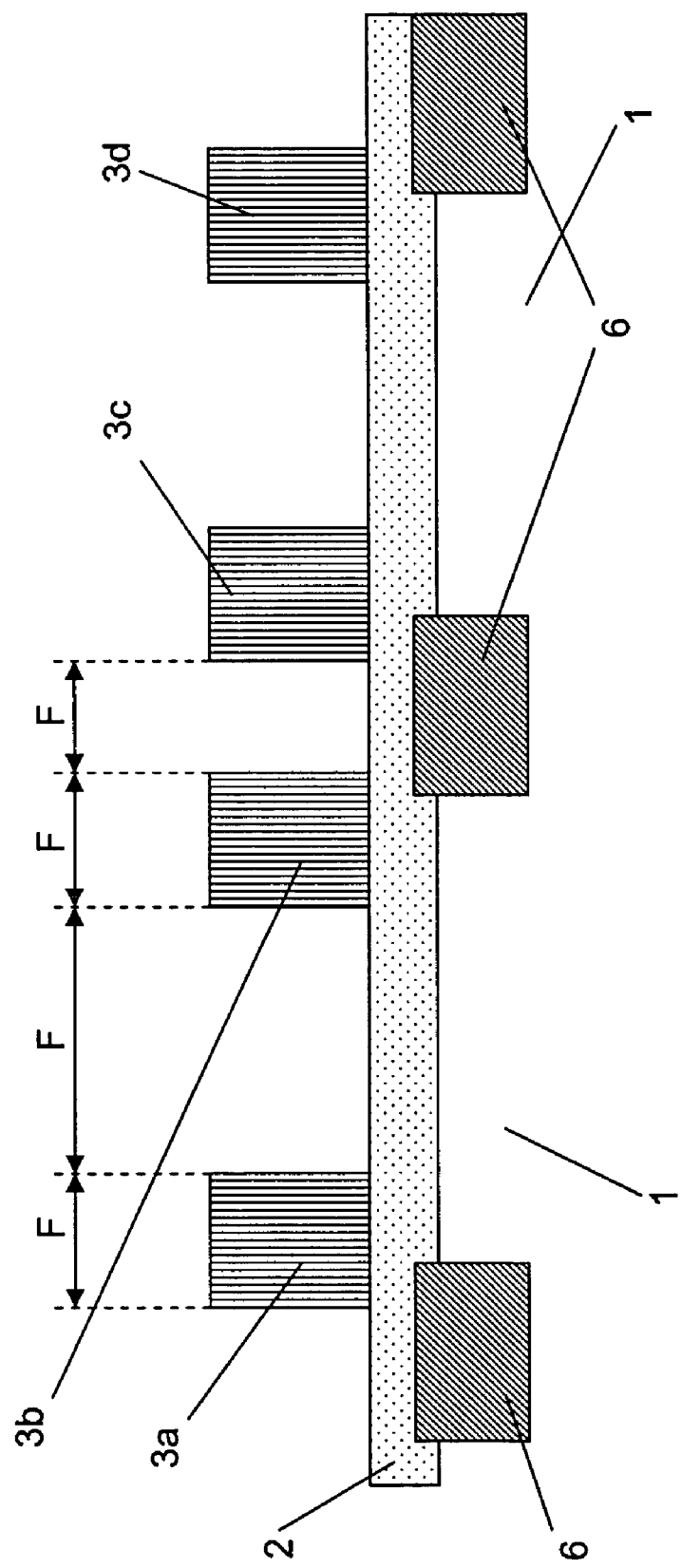

In a simplified process flow the floating gate FG 3a–b is formed using known patterning processes, see "Microlithography, Science and Technology", J. R. Sheats et al. Marcel Decker, 1998. As shown in FIG. 5h a first polysilicon layer 3 is formed on top of the dielectric layer 2. The dielectric layer may for example be an ONO layer. As shown in FIG. 5i the width of the patterned first polysilicon layer 3 is more than the minimal feature size, but the spacing between adjacent polylines 3a–b is the minimal feature size F. As illustrated in FIG. 5i junctions 6 are implanted self-aligned to the patterned first polysilicon layer 3. After forming the implanted bitlines 6, the floating gates 3a–d are patterned using known pattern processes (FIG. 5j). After forming the floating gates 3a–d the second polylayer 9 is formed and a wordline 9 perpendicular to the floating gate 3a–d is patterned in this second polylayer 9 (FIG. 5k), similar to the process illustrated by FIG. 5f. As illustrated in FIG. 5k the junction 6 is further diffused underneath the floating gate 3a–d, e.g. by means of thermal processing steps. Depending on such thermal steps a channel length can be obtained comparable to the channel length of the previous embodiment, which was of sub-lithographic dimensions. This yields a theoretical minimum bit size (1.5F+0.5F)*2F or 4F2/bit, if only one bit is stored underneath the floating gates 3a–d.

In a further embodiment of this invention methods for programming, reading and erasing the memory cell 10 manufactured according to the second embodiment are disclosed. In this fourth embodiment of the present invention methods for programming, reading and erasing the memory cell manufactured according to the second embodiment of this invention are disclosed. As already mentioned, the source-side injection mechanism is no longer easily applicable in this device, since the cell has no program gate as HIMOS® does. A solution herefore is to use secondary injection, n a similar manner to that described in U.S. patent application Ser. No. 09/696,616 by Gang Xue and Jan Van Houdt. Exemplary operating voltages are given in table 2. The values on the left hand side in each column are to be used in case bit 1 is to be addressed. The values on the right hand side in each column are to be used in case bit 2 is to be addressed.

|  | BL1 bit1/ bit2 | BL2 bit1/ bit2 | WL | p-well |
|---|---|---|---|---|
| Program | 4/0 | 0/4 | 5 | ~−2 |
| read-out | 0/1.5 | 1.5/0 | 1.5–1.8 | 0 |
| Erase | 6 | 6 | −4 | 0 |

Table 2: exemplary operating voltages for the memory array of FIG. 5a using drain enhanced secondary injection for programming.

Since the floating gate 3a–d can be made very short in this processing scheme, the read-out voltage at the bitline 6 is able to turn on the channel under bit 2 while reading bit 1 by making use of the drain turn-on effect (DTO). In other words, due to the built-in short-channel effects of the floating-gate 3a–d channels, the reverse read-out scheme is able to 'mask' the bit on the drain side, i.e. the junction at the higher potential, by using only relatively low drain read-out voltages. This is essential for a reliable operation of the cell 10 since higher read-out voltages would cause a reliability hazard through the appearance of stress-induced leakage current after cycling. In other cells, the DTO effect has to be avoided because this short channel effect causes leakage currents in the associated memory arrays. However, due to the split-gate structure, this problem is removed in the proposed invention and the effect is even turned into a beneficial way for screening the bit in series with the one being sensed.

In a fifth embodiment of the present invention a further improvement of the method is disclosed with respect to the second embodiment which was illustrated by FIGS. 5a–g. Two problems are associated with the process of FIGS. 5a–g.

A first problem is overetching of the second polysilicon layer 9 during the stacked poly etch used to define the wordline 9 as well as to create individual floating gates 3a–d. This overetching affects the silicon substrate 1 in the regions where only the second polysilicon layer 9 must be removed, namely at the bitline 6 areas and at area's in between the wordlines 9 and the bitlines 6. The latter area will be p+ doped during the p+ field implant step.

Etching of the bitline 6 area can be avoided by inserting an oxide CMP step after the third step of the formation of the memory cell 10, discussed in the second embodiment of the present invention. In this option a planarizing dielectric, e.g. an oxide, is deposited onto the substrate 1 prior to the step of removing the stripes of the first hard mask 4. The first 4 and/or second 5 hardmask serve as polish stop layers in the subsequent polishing process. After the planarizing step, the process sequence is resumed as outlined above whereby the first polysilicon layer 3 is exposed and further patterned.

With respect to the overetching in the substrate 1 in between wordlines 9, no adequate solution is available, unless one can rely on the filling capabilities of polysilicon on a steep topography in order to end up with a polysilicon layer twice as thick between consecutive floating gates 3a–d. The influence of this problem on memory yield and reliability is unclear.

FIG. 5l shows a top view of the memory array 20 according to this third embodiment after the step of implanting the p+ field implant 11. The p+ field implant 11 electrically insulates the channel regions under the wordlines 9. The bitlines 6 are covered by either the wordline or by the planarizing dielectric 8. By removing the first polysilicon 3 in between the wordlines 9 to separate the floating gates 3, a part of the substrate 1 is exposed. This part is not covered by the planarizing dielectric 8. In this part the p+ field implant 11 can enter the substrate 1. Preferably the p+ implant 11 is given blanket but the substrate 1 area covered by the patterned polysilicon 3 will not be doped.

A second problem is related to the materials choice of the hardmask layers. First 4 and second 5 hardmask layer should preferably use materials other than oxide and nitride, in order to keep the process compatible if for example an ONO interpoly layer is used, which is to be deposited already after deposition of the first polysilicon layer 3. A possible solution may be to use SiC for the first hardmask 4 and poly-Si for the second hardmask 5. In that way the hardmask materials can be etched selectively to each other. However, because of the nature of the process, this requires the SiC mask to have a thickness which is at least equal to twice the floating gate poly thickness. A part of the second hardmask 5 may be etched during the step of etching the first polysilicon 4 in the first step of the formation of the memory cell 10 as described in the second embodiment. When etching the first polysilicon 3 for the second time self-aligned to the second hardmask spacers 5 again part of the second hardmask 5 is consumed. This way, there is some material left from hardmask 2 after etching the polysilicon, and the rest is removed automatically during the second etching step (since it is sacrificial and needs to be completely removed only during the second etching step performed on the first floating poly layer 3). This solution also ensures that the oxide CMP step could stop on SiC.

Another improvement of the method of this invention is described in a sixth embodiment. The aim of this embodiment is to overcome the problems of etching the substrate 1 and choosing hardmask material. This embodiment also offers some additional significant advantages over the previous embodiments.

In this embodiment, a charge trapping layer 31 is incorporated under the first polysilicon layer 3, and the interpoly dielectric 8 is omitted from the process. During the first patterning of the first polysilicon layer 3 no interpoly dielectric 8 needs to be removed and during the step of patterning the second polysilicon layer 9 for defining the wordline 9 the first polysicilicon layer 3 will not be removed. Apart from these two changes, the process described with respect to FIGS. 5a–g is still valid. This charge trapping layer 31 should be capable of locally storing and retaining charge injected to selected locations within this layer and prevent diffusion or displacement of the injected charge. The charge trapping layer 31 may be but is not limited to a sandwich of dielectric layers, whereby the outer dielectric layer isolate the middle layer(s) from the polysilicon gate 3a–b and substrate 1. The middle dielectric layer(s) is/are used as a charge trapping or charge-storing layer 31. This charge trapping layer 31 may be for example a nitride layer where the non-conductive nitride layer is dimensioned such as to prevent dispersion of charge stored at different positions within the nitride layer, an oxide layer with buried separated polysilicon islands where the charge is stored within these conductive polysilicon islands, a layer comprising separated silicon microcrystals, where the charge can be stored in these separated silicon microcrystals.

Figure 6A:
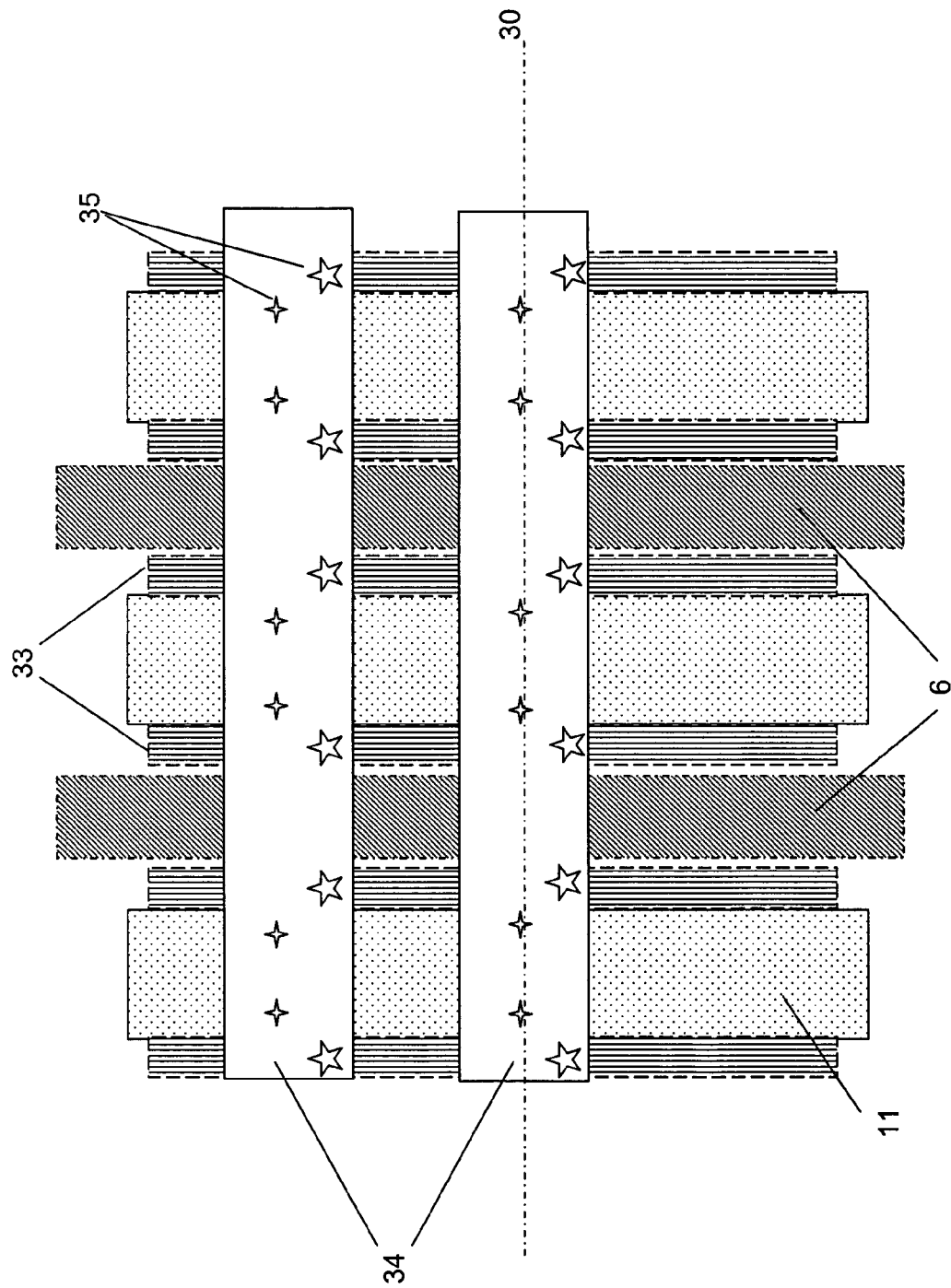
FIGS. 6a and 6b show a top view and cross-section of the array configuration of a fourth embodiment of the present invention for the case of source-side injection into a charge trapping layer.
Figure 6B:
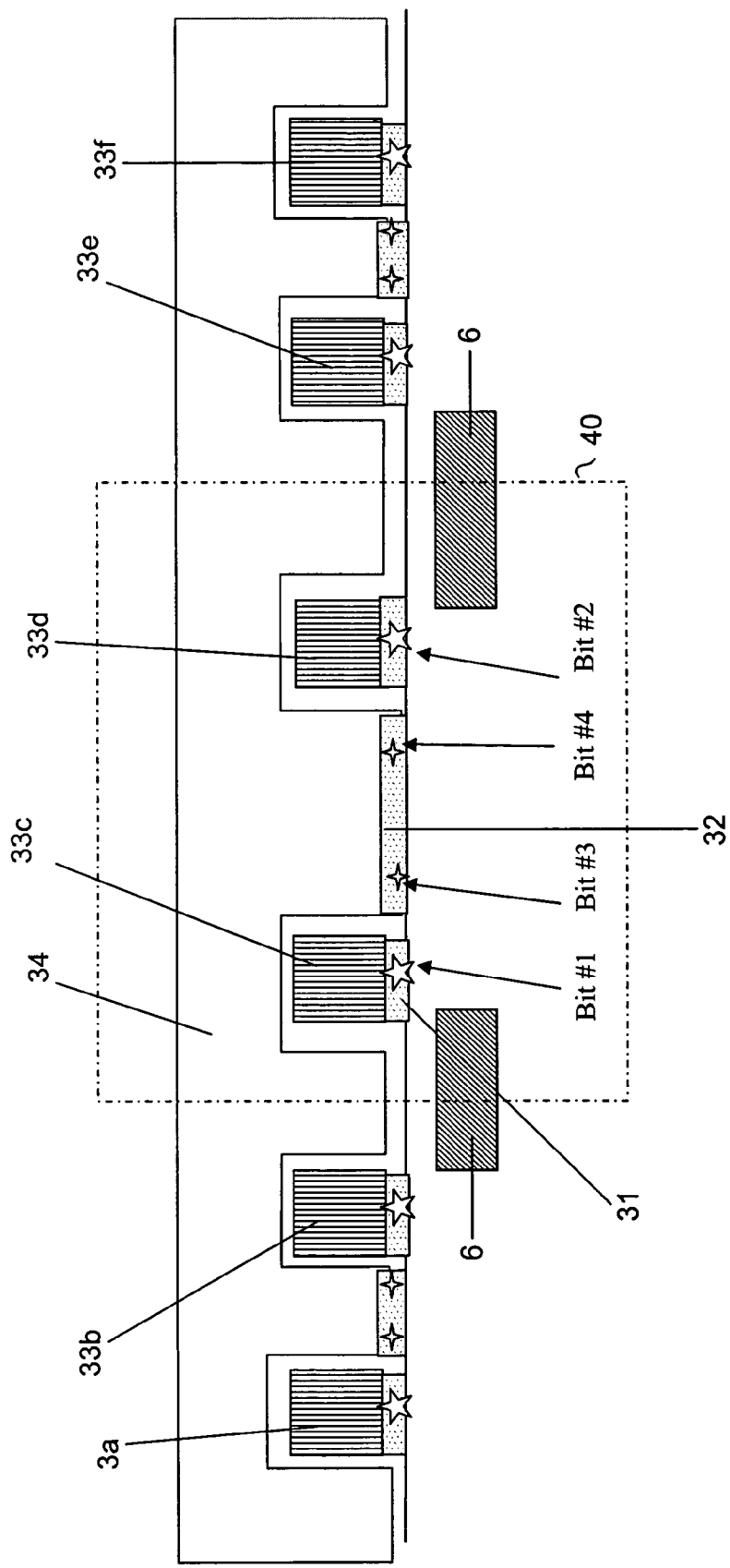

FIGS. 6a–b show the resulting array configuration. The final cross-section of the cell along the channel direction 30 (indicated in FIG. 6a) is shown in FIG. 6b and is similar to cross-sections illustrated in FIG. 5a–g. Different is the presence of a charge storing dielectric 31, which may be for example a nitride layer or oxide-nitride-oxide (ONO) stack, under the program lines 33 made in the first polysilicon layer 3 to store the information bit. Such charge storing dielectric may also be present under the wordlines 34 made in the second polysilicon layer 9, at least above the channel part of the wordline 34. The channel part of the wordline 34 is the substrate region between the two program lines 33 located in the area formerly covered by the patterned first hardmask layer 4. The polysilicon stripes 33a–f, formed in the first polysilicon layer 3 by etching the first polysilicon layer 3 selfaligned to the spacers 5 formed in the second hardmask 5, are no longer "floating" to store the bit charge on, but form in this embodiment, vertical, i.e. perpendicular to the wordline 34, stripes 33a–f. Such polysilicon stripe now forms a program line 33a–f connected to the column or bitline decoder instead. Eventually, a second charge storing dielectric 32, which may be for example an ONO layer, may be formed at least under the wordline 34 itself. This second charge storing dielectric 32 will be deposited after patterning the polysilicon stripes 33 and prior the step of depositing the second polysilicon layer 9. This second charge storing dielectric 32 is used to also store 2 inner bits but now under the wordline 34 above the channel part of the wordline 34. Thus, this embodiment results in a memory cell 40 with 4 bits.

When in this embodiment for example a nitride layer is used for charge storage, important advantages are obtained with respect to the structure in the previous embodiment. As further alternatives to a nitride layer, a nitride oxide layer or a polysilicon layer with nanocrystals can be used. Since the first polysilicon layer 3 is now routed vertically, i.e. parallel to the bitlines 6, to form a program line 33a–f connected to the column decoder, there is no stacked poly etch required, and the first problem of the previous embodiment is removed. The first polysilicon layer 3 is no longer used to form floating gates 3a–d. Another advantage is that because an dielectric layer 31 is now used underneath the first polysilicon layer 3 (and eventually also under the second polysilicon layer 9, see further) and no longer as an interpoly dielectric 8, also the second problem is removed. The first hardmask layer 4 may now for example be a simple deposited oxide, and the second hardmask 5 may for example be a conventional nitride layer. The incompatibility with the interpoly layer 8 and the compulsory use of SiC and polySi as hardmask layers can be avoided. Also the restriction that the first hardmask layer 4 needs to be at least twice as thick as the first polysilicon layer 3 is no longer required. This is also beneficial because it allows to make the channel length under the first polysilicon gate 3a even shorter to further decrease the cell size.

Furthermore, next to the advantages with respect to the structure of the previous embodiment the structure in this sixth embodiment has some additional advantages. Since the program line 33 can be used for decoding and thus can be biased, source-side injection of charge can be used for programming. The program gate together with the underlying charge storing dielectric 31 form a transistor structure and hence the channel region of this transistor can be brought in inversion, accumulation or depletion. This mechanism is advantageous from power consumption point of view, especially because of the inherently high sheet resistance of the buried bitlines 6. Also, source-side injection of charge allows to further reduce the voltages on word-34 and bitlines 35 as lower voltages are needed for programming. Table 3 list the typical voltages used in this embodiment for programming, reading and erasing the memory cell 40 shown in FIG. 6b. The values on the left hand side in each column are to be used in case bit 1 is to be addressed. The values on the right hand side in each column are to be used in case bit 2 is to be addressed.

|  | BL1 bit1/bit2 | BL2 bit1/bit2 | WL | PL1 bit1/bit2 | PL2 bit1/bit2 |
| --- | --- | --- | --- | --- | --- |
| program | 3.3/0 | 0/3.3 | 1 | 6 | 6 |
| read-out | 0/1 | 1/0 | 2 | 2/5 | 5/2 |
| erase | 6 | 6 | — | −4 | −4 |

Table 3: exemplary operating voltages for the memory array of FIGS. 6a–b using source-side injection into trapping layers and reverse read-out.

The bits of the array shown in FIGS. 6a–b are thus preferably programmed by source-side hot-electron injection on both program lines 33a–f for the dual bit configuration, erased by hot-hole injection which is triggered by band-to-band tunnelling of valence electrons in the drain junction, i.e. at the junction which is at a high potential, and read-out by reverse sensing. Reverse sensing for read-out is, however, not necessary since both bits can be separately controlled by their corresponding program lines 33a–f anyway. One can bias a program line 33a–f high enough to mask the influence of the stored charge on the underlying channel region. In the example given below it is assumed that the threshold voltage $V_t$ window of each program line transistor structure is positive and is between e.g. 0.5V and a maximum value of 2.7V. The low threshold voltage, i.e. without charge stored, is typically equal to the intrinsic $V_t$ which is about 0.5V. The high $V_t$, which for the charged bit, is limited to the voltage difference between the program line 33a–f and the bitline 6 voltage since for a high threshold voltage above this voltage difference the current through the channel region underneath the program line 33a–f comprising the charged bit, will stop flowing. This yields a maximum high threshold voltage $V_t$ of 2.7V in case the program line 33a–f is biased at 6V and the bitline 6 at 3.3V. This threshold voltage window, 0.5V vs. 2.7V, allows to sense the bit at an intermediate voltage of 2V at the corresponding program line 33a–f. The other program line 33 of the memory cell is then biased at 5V in order to screen out its effect, namely the influence of a possible stored bit. When using forward read-out, this 5V 'transfer voltage' could be reduced to 4V for the same read-out current since the bulk effect caused by the drain read-out voltage is removed in that case. This yields the following alternative table of operating voltages (table 4a).

|  | BL1<br>Bit1/bit2 | BL2<br>bit1/bit2 | WL | PL1<br>bit1/bit2 | PL2<br>bit1/bit2 |
|---|---|---|---|---|---|
| Program | 3.3/0 | 0/3.3 | 1 | 6 | 6 |
| Read-out | 1/0 | 0/1 | 2 | 2/4 | 4/2 |
| Erase | 6 | 6 | — | −4 | −4 |

Table 4a: exemplary operating voltages for the memory array of FIGS. 6a–b using source-side injection into trapping layers and forward read-out.

Compared to the floating-gate version, there is another peculiarity in the charge trapping dielectric 31 case which is advantageous. The polysilicon stripe 33a–f formed in the first polysilicon layer 3 runs all along the column of cells which are all connected to the same bitline 6. The polysilicon stripe 33a–f is parallel to this bitline 6. This implies that the area below this polysilicon stripe 33a–f is not implanted by the p+ isolation implant 11 used to form the field region and to electrically isolate the wordlines 34. As a consequence, the high voltage applied to the program lines 33a–f will invert the entire active area underneath the program lines 33a–f, not only the active area at the crossing of the program lines 33a–f and the wordline 34. This increases the effective electrical width of the program line transistor channel and helps substantially in reducing the large parasitic resistance of the buried bitlines 6 and therefore it increases the read-out current and reduces memory access time.

The memory cell 40 illustrated in this sixth embodiment has some major advantages with respect to NROM™ and MirrorBit™ as well as there is lower power consumption during programming as source-side injection only requires a few μA of channel current for the same speed, easy drain engineering as the junction forming the bitline 6 needs only be optimised for erasing, while in the NROM™ case, drain optimisation is a delicate balance between write and erase efficiency. The memory cell 40 in this embodiment has the feature that each bit has a separate program line 33a–f which makes it easy to screen the bit in series with the one to be programmed and/or read-out. Furthermore, the channel lengths of the device (under program line 1, under the word line 34 and under program line 2) are scalable since there is no issue of both bits being smeared out in the same channel causing overlap between both charge distribution. This should allow making the device considerably smaller and faster than NROM™ which typically needs a long channel to cope with this problem.

In the above description it was indicated that the threshold voltage $V_t$ of the gates in which charge is to be stored will vary between the intrinsic threshold voltage of the gate structure which is typically 0.5V and a high threshold voltage, which is shifted proportional to the amount of charge stored in the charge trapping dielectrics. Typically this high voltage is about 2.7V. The thus obtained threshold voltage of 2.7–0.5 V should be large enough to differentiate between the charged and uncharged state. As indicated in table 4a, a voltage up to 6 V is needed on the program lines 33a–f to program the outer bits bit 1 and bit 2, because this program voltage must be higher than the sum of the junction voltage (3.3.V) and the charged $V_t$ value (2.7V) to create a conductive channel underneath the gate. The present invention however offers the opportunity of using lower programming voltages by downshifting the threshold window. As will be discussed in further embodiments in this application hot holes generated from band-to-band tunneling and subsequent heating in the lateral field can be generated from a hard source junction hot-hole injection for erasing but can only travel a limited distance in to the structure and will only affect the outer two bits underneath the program gates. The generated hot holes cannot be accurately redirected towards the trapped electrons but will be injected in the whole of the charge trapping layer 31. Hence not only the local charge, i.e. the electrons in bit 1 or bit 2, is erased or compensated by the injected hot holes but also positive charge is stored in these bits. This positive charge will result in a lowered threshold voltage for the two outer bits. This so-called "overerasing" of the stored negative charge has the advantage that instead of varying the threshold of the program gates between typically 0.5V and 2.7V the extreme values can be shifted down to typically −1V in case hot holes are injected and 1V in case electrons are injected. In table 4b the change in program voltages is shown if such "overerase" effect, resulting from injecting opposite charge during the erasing of charged bit, is exploited.

|  | BL1<br>Bit1/bit2 | BL2<br>bit1/bit2 | WL | PL1<br>bit1/bit2 | PL2<br>bit1/bit2 |
|---|---|---|---|---|---|
| program | 3.3/0 | 0/3.3 | 1 | 4.5 | 4.5 |
| read-out | 1/0 | 0/1 | 2 | 0/2.5 | 2.5/0 |
| erase | 6 | 6 | — | −4 | −4 |

Table 4b: exemplary operating voltages for the memory array of FIGS. 6a–b using source-side injection into trapping layers and forward read-out in case the threshold window of the outer gates can be shifted to lower voltages.

A specific consideration of the dual bit cell of the sixth embodiment is now described in another embodiment of the present invention. In this case an additional dielectric layer 32 will be formed after forming the program lines 33a–f in the first polysilicon layer 3. This dielectric layer 32 is used as a charge storage/trapping layer 32 underneath the second polysilicon layer 9.

To program bits under the wordline 34 in the channel region, the role of the wordline 34 and program line 33 need to be reversed for programming and for reading: e.g. writing bit #3 needs WL=PL2=6V, PL1=1, BL1=0 and BL2=3.3.

This is under the assumption that bit #1 is unprogrammed. In the other case PL1=3.7V should be used instead (see further on). Secondly, it should be noted that PL2−BL=2.7V, thus for programming bit #3, the $V_t$ of programmed structure containing bit #2 should be smaller than 2.7V in order to have a detectable channel current. Alternatively, one could increase the programming voltage of the second program line 33 to 7V to resolve the problem. The middle channel, containing bits 3 and 4, is a conventional n-channel with trapping gate dielectric in which the other bit now has to be screened by the space charge region of a virtual drain region during read-out i.e. the inversion layer under the adjacent program line 33.

The major advantage of the sixth embodiment is that the effective bit size is now reduced to $1F^2$ and a quadruple bit memory cell is obtained. Since the inner bits use the same gate, namely the wordline 34 or control line, for sensing, reverse read-out is mandatory for obtaining a sufficiently large window for these inner bits. By first programming the outer bits, the wordline 34 voltage need never be adjusted according to the content of the inner bits. Indeed, first the outer bits, i.e. under the program lines 33, are programmed according to table 3 or 4. Then, the inner bits, i.e. under the wordline 34, are programmed sequentially. Programming of bit #3 requires a voltage on program line 1 around the optimum for source-side injection (1V or 3.7V depending on the value of bit #1, or close to the $V_t$ of the select channel (see applicant's patents U.S. Pat. Nos. 5,583,810 and 6,044, 015). For bit #4, this optimum similarly depends on the value of bit #2. The outer bits are thus to be contained in a buffer in order to decide on the optimum value of the voltages on the program lines 33a–f for programming the $3^{rd}$ and the $4^{th}$ bit of the device. Nothing changes for the outer bits, except for maybe a somewhat higher transfer voltage on the wordline 34 for reading these bits, while the $3^{rd}$ and $4^{th}$ bit are programmed by reversing the role of wordline 34 and program lines 33a–f, respectively, and by using the values of bits #1 and #2 as an input for the first and second program line voltages when programming bits 3 and 4, respectively. Since bits 1 and 2 can easily be stored within the periphery, this solution adds only a marginal cost to the memory chip. Alternatively, an intermediate read operation could be considered instead. Since reading a Flash cell is a few orders of magnitude faster than programming, this solution would not compromise the speed nor the throughput of the device. On the other hand, verify techniques which are frequently used in Flash memory also require read-during-write operations and the associated circuitry is, therefore, often readily available.

Finally, the gate voltage over the outer bit (1 or 2) could also be ramped up during programming to make sure that the maximum source-side injection gate current is always obtained sometime during the programming pulse. Such a solution would remove a lot of the overhead discussed above and would no longer require the knowledge of bits 1 and 2 in order to write bits 3 and 4. For erasing, it is assumed that negative voltages on all gates will enable the hot holes to erase all 4 bits simultaneously. This should be possible because the distance between an outer and an inner bit is only of the order of the ONO layer thickness (typically 5+5+5=15 nm).

The operation of the quadruple-bit memory cell is summarised in table 5. It is assumed that the threshold window of the bits is between 0.5 and 2.5V which implies that the program line has to be biased at 3.5V for programming bit #4 in case bit #2 is written, and for programming bit #3 in case bit #1 is written as indicated by the symbols f and g in the table, these values depend on the values of the outer bits.

Indeed, the optimum value for source-side injection simply shifts with the value of the threshold voltage of the select channel. It should be noted that writing bit #4 is more critical than writing bit #3: in case #3 is written, the channel current when programming bit #4 will already be lower because of the series effect of bit #3 (WL−BL=2.7V and the $V_t$ of the middle channel is 2.5V!). Theoretically, bit #4 should be programmed under constant channel $V_t$, but in practice, asymmetries could be introduced. A further refinement could provide an increase of the necessary word line 34 voltage while programming bit #4 dependent on the value of bit #3. This, however, increases the maximum voltage to be switched in the periphery. A low-end solution could be to skip bit #4 and use the cell as a triple bit device instead.

|  | BL1 bit1/2/3/4 | BL2 bit1/2/3/4 | WL bit1/2/3/4 | PL1 bit1/2/3/4 | PL2 bit1/2/3/4 |
|---|---|---|---|---|---|
| program | 3.3/0/0/3.3 | 0/3.3/3.3/0 | 1/1/6/6 | 6/6/f/6 | 6/6/6/g |
| read-out | 1/0/0/1 | 0/1/1/0 | 4/4/2/2 | 2/4/4/5 | 4/2/5/4 |
| erase | 6 | 6 | −4 | −4 | −4 |

Table 5: exemplary operating voltages for the memory array of FIG. 6b using source-side injection into trapping layers at 4 distinct positions in the channel (f=1 if bit 1=0 and f=3.5 if bit 1=1, g=1 if bit 2=0 and g=3.5 if bit 2=1).

The table assumes that the outer bits are read-out in the forward direction while the inner bits are read in the reverse way. Notice that the voltages on the program lines 33a–f differ by 1V when reading the inner bits to compensate for the bulk effect of the drain read-out voltage.

One of the main problems with the n-type cell that uses electron trapping in a nitride layer, is related to the erase operation. The hot holes generated from band-to-band tunneling and subsequent heating in the lateral field can hardly be generated from a virtual drain junction and, therefore, have to travel a long way from the junction to arrive at the trapping site(s). In fact, this is the reason why the principle cannot be extended to more than 4 bits between source and drain. On the other hand, the mechanism is not very efficient since the barrier for holes into $SiO_2$ is as high as 4.8 eV (as compared to 3.2 eV for electrons). This requires high voltages (5V or more) to be applied to the drain, combined with a sufficiently high negative voltage at the gate. This increases the maximum voltage on chip while still offering only a slow erase operation in the order of 100 ms. Another problem with using band-to-band-tunneling induced hot-hole injection for erasing, is the following: it may be a problem to erase all bits at once if the hot holes can not be accurately redirected towards the trapped electrons. Using Fowler-Nordheim tunneling is not feasible because the higher dielectric constant of silicon nitride as compared to silicon dioxide causes most of the applied gate voltage to drop over the oxides and not across the nitride layer. Removing electrons by tunneling is, thus, not possible unless a very thin bottom oxide is used as in SONOS and MNOS memory but then the main advantage of local charge trapping by hot-carrier injection into a nitride layer is lost, i.e. the much better reliability and charge retention than that of SONOS.

To alleviate these problems, the present invention provides in one aspect use of source-side hot-hole injection. In that case, only n- and p-type doped regions have to be switched in the device structure described before. Thus, the cells are formed in an n-well while source and drains (or bitlines) are formed by a p⁺ Boron implant. The fieldless isolation is now realized with an n⁺ implant in between the active areas. Since the barrier for holes is 4.8 eV, a drain-to-source voltage of 5V is required for programming and typical operating voltages could be: BL1=n-well=5V, PL1=BL2=0, PL2=−3V, WL=4V. Erasing requires 4V at the gates (PL1 and PL2 for the dual bit version), while the bitlines 6 are biased at −3.5V. Using channel hot-hole injection enables to turn off the channel below a certain gate (PL1 PL2 or WL) when trapping occurs at the source side of that channel just in the same way as source-side hot electrons do for the n-channel case.

An advantage of this embodiment is that BTB induced hot-electron injection can be used for erasing. This requires only moderate voltages. Another advantage is that FN tunnelling is feasible since now electrons are to being injected into the nitride from the substrate. If also the rest of the channel area is injected with electrons, this does not cause any problems since the high $V_t$ is simply increased which increases the read current.

Figure 7A:
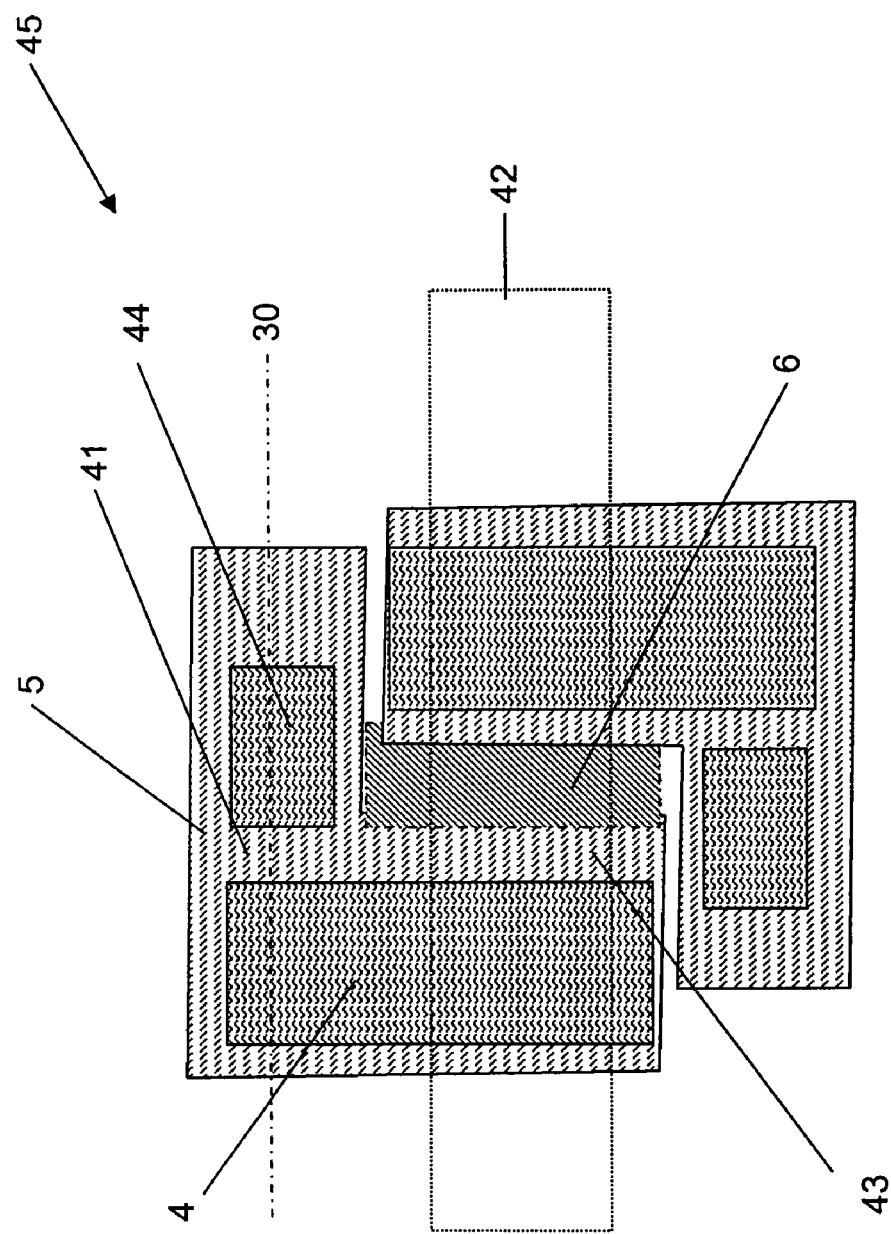
FIGS. 7a and 7b show a top view and cross-section according to a sixth embodiment of the present invention in case dummy structures are used to create contact pads
Figure 7B:
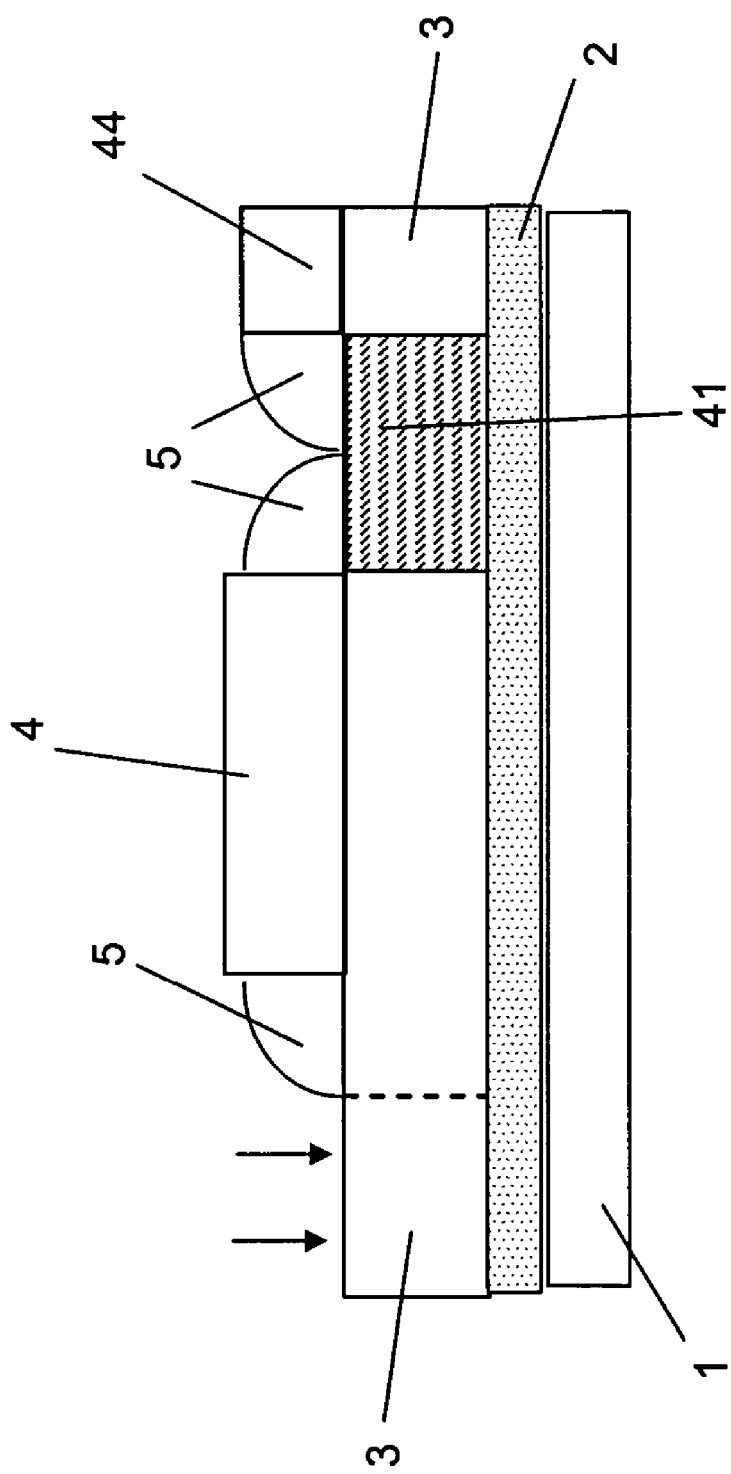

In an eighth embodiment, which is illustrated by FIGS. 7a–b, the 'contactability' of the memory array 45 is disclosed. It has been explained in the prior art section that spacers 5 are not easily contacted because they are not defined by a lithographic masking step. Hence they are typically too narrow in order to fit a contact into it at the edge of the memory cell array 45. In the case of the floating-gate version of the present invention, the issue disappears because the charge storage gates 3a–d in the first polysilicon layer 3 defined by the second hardmask spacer 5 are to be left floating by definition in that embodiment. However, when using a charge trapping layer 31 under this first polysilicon gate 3a–d, this first polysilicon gate is to be routed all along the bitline 6 direction in order to contact it to the column decoder. As explained, the problem of connectivity is much smaller in the present invention as compared to solutions where the gates are true poly spacers (mainly because of uniformity issues), but still the width of this gate is so small that it requires special contact solutions. An obvious way is to draw a dummy rectangle 44 on the first hardmask layer 4 level close to the first hardmask stripe 4 which is used to define the tow parallel first polysilicon stripes which will be used as program gates 43. This dummy square 44 at one side of one end of the first hardmask 4 stripe will create two spacers formed in the second hardmask 5, one against the dummy square 44 and one against the first hardmask 4 region, touching each-other. This way, the two second hardmask 5 spacers, i.e. lying against the first hardmask 4 stripe and against the dummy first hardmask square 44, will touch thereby covering a larger part of the underlying first polysilicon layer 3. A double width of the first polysilicon stripe is obtained at the step of patterning of the first polysilicon level 3 when executing the process flow of the present invention (see FIGS. 7a–b). This solution would not work in a true poly spacer technology since it is impossible to make a reliable and reproducible spacer-to-spacer contact in that case. In the case of the present invention, the spacers only have to touch in order to double the area of the remaining polysilicon without any impact on the topography of this remaining poly layer. Using 2 dummies 44, a poly square with an $2t_{sp}*2t_{sp}$, where $t_{sp}$ is the width of the second hardmask spacer 5, is obtained. It is clear that adjacent program lines 33 have to be contacted on opposite sides of the memory array 42 because of the minimized pitch. This way an enlarge part of the first polysilicon stripe is formed at end of the first polysilicon stripe or program gate 43. By alternating forming this extension to the program gates 43 successive program gates 43 are contacted alternately at opposite sides of the memory array. The successive first hardmask 4 stripes can be formed in an indent way leave space at the end of each first hardmask 4 to form a dummy rectangle 44 linked to a neighbouring first hardmask 4 stripe.

If the resulting area is still not sufficient for contacting the program gate 43, a more radical solution is described below relating to a new embodiment of the present invention. It has to be noted that the following solution is only possible because the spacer 5 itself is sacrificial and only serves to define a lateral dimension in the final memory device.

FIGS. 8a–f illustrate this contacting embodiment. On the left hand side of each cross section the formation of the contact areas is shown while on the right hand side the formation of the memory cell is shown.

Figure 8A:
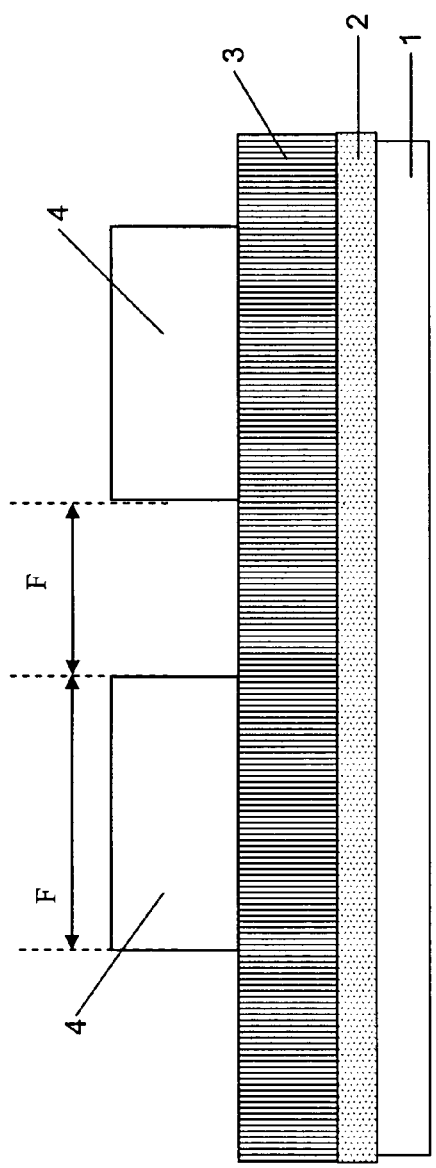

First an gate dielectric layer 2, which may for example be an oxide-nitride-oxide (ONO) layer, and a first polysilicon layer 3 are formed (FIG. 8a). Then a thin oxide and a first hardmask layer 4 (HM1) are deposited. The first hardmask layer 4 could for example be a nitride layer. The first hardmask layer 4 is patterned in vertical stripes along the bitline 6 direction as shown in FIG. 8a.

Figure 8B:
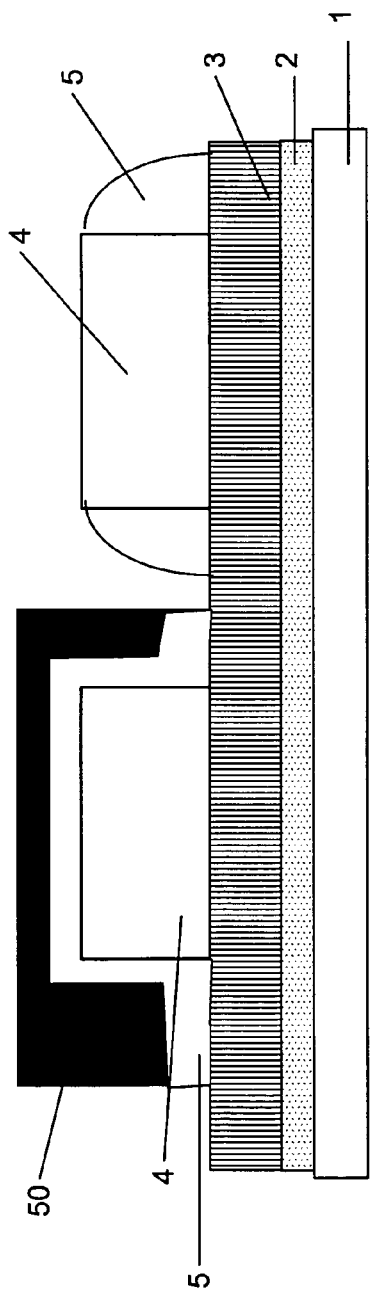

Secondly, a second hardmask 5 is conformally deposited over the substrate (FIG. 8b). This second hardmask layer 5 should be a polysilicon layer for reasons that become clear later on. A resist layer 50 is applied to this second hardmask 5. This resist layer 50 is patterned to yield contact pads 41 formed in this second hardmask 5. The overlap of the resist 50 over the patterned first hard mask 4 will define the contact pad area 41 because the part of the first polysilicon layer 3 underneath the patterned first hardmask 4 will be removed further on in the processing leaving only small stripes of first polysilicon 3a–d. Using the patterned resist layer 50 as a mask, spacers are formed in the exposed part of the second hardmask. During this etching step, a spacer in the second polysilicon layer is created at least along the HM1 stripe 4 in the vertical direction of the memory array as shown in FIG. 8b.

Figure 8C:
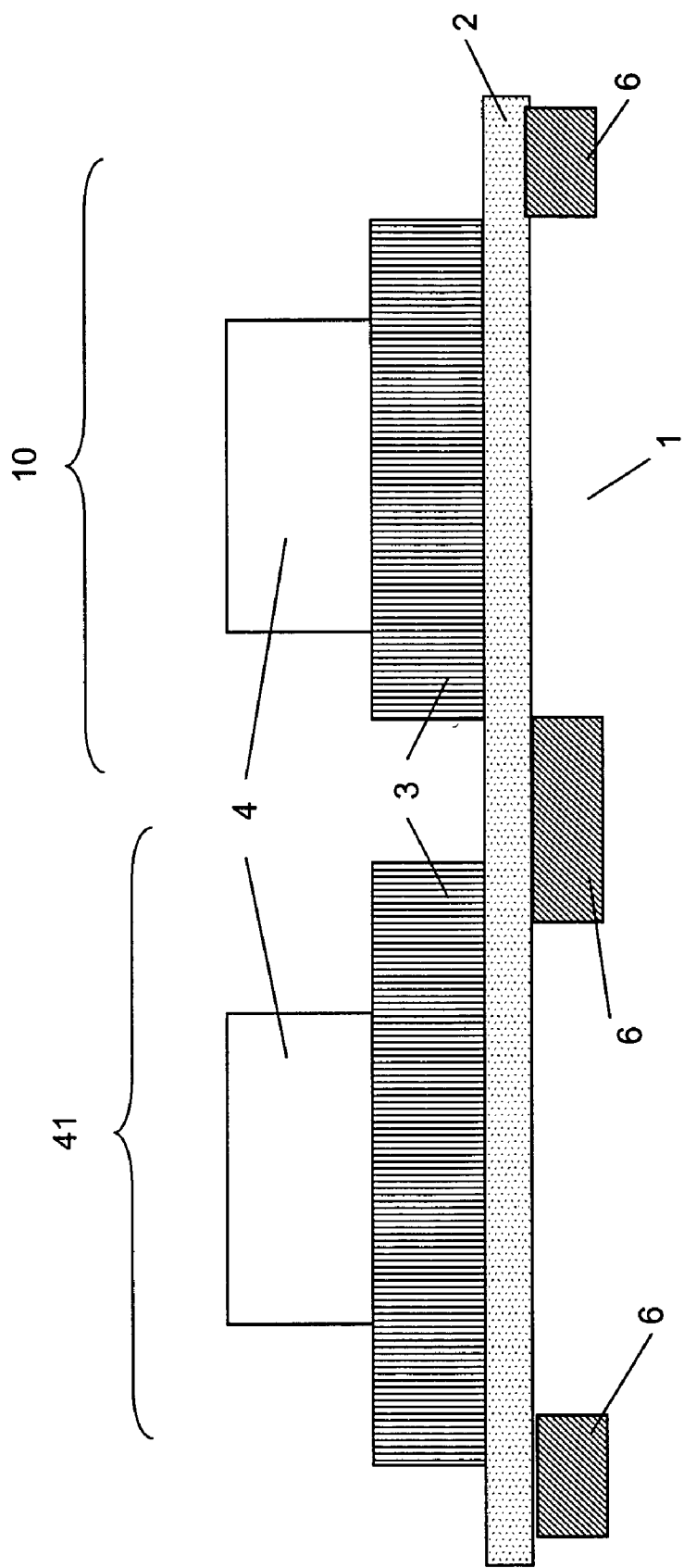

Subsequently the patterned resist is stripped. The oxide layer on top of the exposed first polysilicon layer 3 is removed. Then the first polysilicon layer 3 is etched self-aligned using the patterned first 4 and second 5 hard mask region to protect the underlying first polysilicon layer 3. As the second hardmask 5 is also polycrystalline silicon the spacer formed in the 2$^{nd}$ polysilicon layer 9 to define the program lines 33a–f as discussed in the previous embodiments of this aspect is removed while etching the first poly layer 3. Simultaneously, the patterned second poly 5 is removed in the contact pad areas 41 while also defining the size of these areas. Then, the junctions 6 are implanted self-aligned to the patterned first polysilicon layer 3 in order to form the bitlines 6 as shown in FIG. 8c.

The substrate is covered with a planarizing dielectric 60 which is polished down to the first hardmask layer 4. After planarizing the structure with an oxide CMP step (stopping on the HM1 layer), the patterned first hardmask 4 is removed selectively with respect to the CMP oxide as shown FIG. 8d.

The second etch of the first polysilicon layer 3 is performed in order to create stripes 3a–d of the first polysilicon layer 3 which will result in 2 sub-lithographic program gates 3a–d, one on each side of the device as discussed in previous embodiments of this aspect. The overlap of the planarizing dielectric 60 over the patterned first polysilicon layer 3 is defined by the width of the spacers formed in the second hardmask 5 and this overlap will define the width of the program lines 3a–d formed by stripes of first polysilicon layer 3 (FIG. 8e).

Figure 8F:
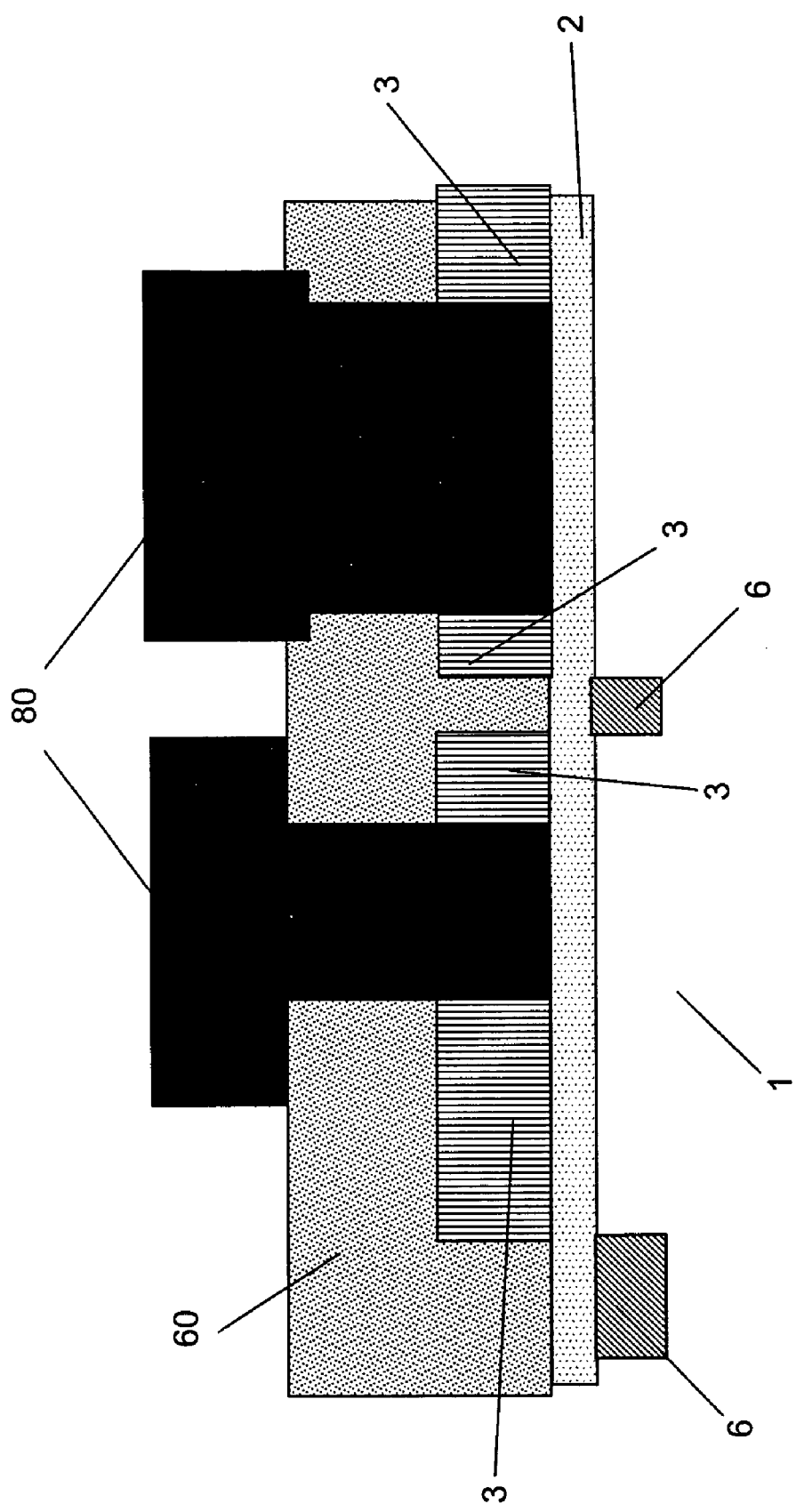

The exposed gate dielectric 2 is also removed. This is the gate dielectric at the bottom of the cavity 61 created by removing the first patterned hard mask 4 and the underlying first polysilicon layer 3. A second gate dielectric is deposited which could be an oxide or again a combined ONO layer for the case of a quadruple-bit cell as discussed in the fourth and fifth embodiment of the present invention. A next, i.e. third, polysilicon layer is deposited on top of the substrate. This second gate electrode material or third polysilicon layer is patterned to form the wordline 80 of the dual-bit structure in a fully self-aligned manner in a direction perpendicular to the bitlines 6 as discussed in previous embodiments of this aspect and as shown in FIG. 8f.

Finally, the array is finalized by providing a p$^+$ implant in between the wordlines 80 as explained already in the previous embodiments of the invention.

The final device is similar to the one described in the sixth and seventh embodiment in terms of operation and properties as well as cell size. In order to limit the overetch time of the final wordline etch, the 1$^{st}$ polysilicon layer 3 should preferably be kept thin (e.g. 75 nm, preferably in the range 50 to 150 nm). Also the CMP oxide should be typically 75 nm thick, e.g. in the range 50 to 150 nm. This would lead to a minimum wordline poly thickness of 150 nm. The proposed contact scheme leaves 2 contacts pads 41, one at each side of the first hardmask stripe 4 at contacting each of the program lines that share a cell column (see FIG. 9). This is only possible because the actual contact 41 pad definition is performed on the level of the sacrificial polysilicon layer and not on the functional polysilicon layer. In other words, if a true spacer technology had been used, it is not possible to have both contact pads 41 on the same side because they would then short circuit both program lines. In that case, the bonding pads 41 have to be on opposite sides of the bitlines 6, which increases the spacing between the bitlines 6 by at least a factor of 2 as compared to the currently presented invention. Indeed, when using the proposed scheme, the poly pads 41 can be placed outside of the aggressive cell pitch as shown in FIG. 9 resulting in no additional limitation from the point of view of memory density due to contact issues. As in all spacer-based processing schemes, an additional mask is to be added for cutting the short circuit between adjacent program lines formed in the same polysilicon layer. Unlike the case of true spacer technology (i.e. when the spacer is still present in the final device structure), the presented invention allows this cutting mask to be added also on the level of the sacrificial spacer instead of at the end of the (program) gate formation.

Figure 10:
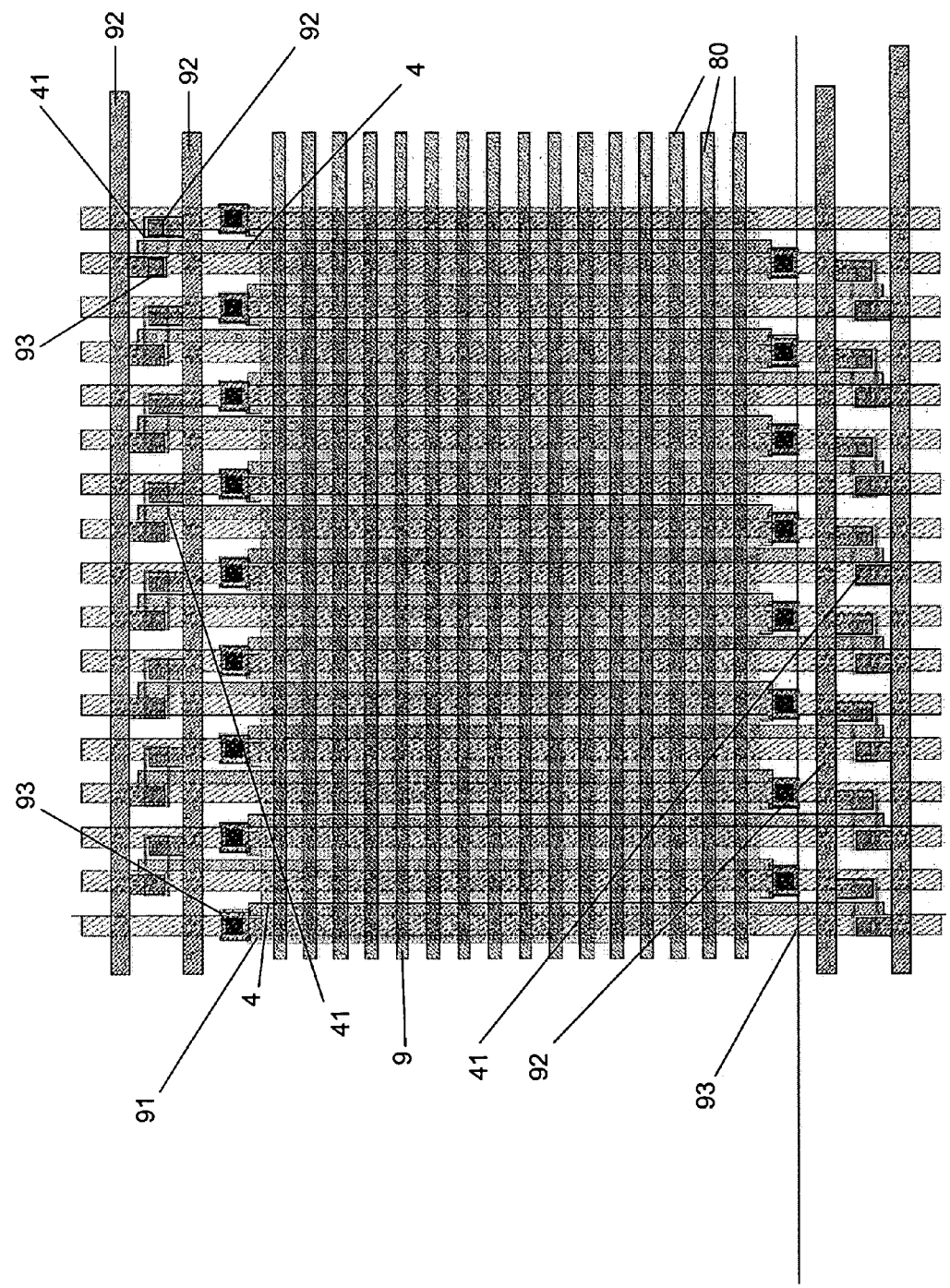

FIG. 10 further illustrates the advantage of the proposed device and processing scheme. On top of an "active area" 91 region (green, "active") a sequence of horizontal wordlines 80 perpendicular to the bitlines 6 is present. On this example these horizontal lines are not contacted. The first hardmask region 4 is used to define the second hardmask spacers 5 which in their turn are used to define the underlying programs gates extending from one side of the matrix to the other side. The width of the first hardmask region 4 defines the spacing between the parallel program gates 3a–d. The program gates 3a–d of one HM1 region 4 are contacted at one side of the matrix by adding the contact pad region 41, while the program gates 3a–d corresponding to neighbouring HM1 regions 4 are contacted at the opposite side of the memory matrix 90. The program gates 3a–d are contacted by metal 1 lines 91. The bitlines 6 running parallel with the program gates 3a–d are contacted at the top and bottom of the matrix 90 as shown in FIG. 10 by metal 2 lines 93. The individual cells are only isolated by the p+ implant 11 given in the exposed active area region 91.

In conclusion, the device proposed in different embodiments of the present invention only takes 2 masks (program line spacing: patterning of the first hardmask 4 and word line etch: patterning of second 9 or third polysilicon layer perpendicular to bitlines 6) for processing (not considering contacting issues). The device uses no special materials, is fully self-aligned in a true cross-point array, yielding completely separated bits in a contactless virtual ground array with a 2F$^2$ bit size or a potential 1F$^2$ bit size version when also programming the inner bits (quadruple bit version).

As compared to alternative charge trapping devices that make use of spacers, the current invention has the major advantage that the same dimensions are realized without however showing the disadvantages of poly spacers for the gate level. Indeed, by using a double hardmask scheme, a sacrificial spacer is used on a higher level (above gate poly or first polysilicon layer 3) which realizes the same sub-lithographic features. Doing this, the problems associated with spacer non-uniformities and interconnect issues are resolved.

Finally, it is clear that storing 4 bits between source and drain is the maximum possible number, if one wants to erase the device by band-to-band-tunneling induced hot hole injection. Structures having even more gates in series between source and drain would not be erasable because of the distance between the junctions and the stored charges. Erasing from a virtual drain junction instead would require too high doping concentrations which would jeopardize the breakdown behavior of the cell and increase the intrinsic Vt leading to higher operating voltages. Fowler-Nordheim tunneling from the nitride trapping layer towards the silicon substrate is quite impossible because most of the voltage applied to the gate will drop over the oxide (bottom and top) layers and not over the nitride because of its higher dielectric constant.

It is to be understood that although preferred embodiments, specific constructions and configurations, as well as materials, have been discussed herein for devices according to the present invention, various changes or modifications in form and detail may be made without departing from the scope and spirit of this invention.

What is claimed is:

1. A method of forming a multibit non-volatile memory cell structure, comprising:

depositing a first polysilicon layer on a semiconductor substrate of a first conductivity type;

depositing and patterning a first hardmask layer to form at least a first hardmask region upon the first polysilicon layer;

depositing and anisotropically etching a second hardmask layer forming second hardmask spacers adjacent to the at least a first hardmask region;

selectively removing exposed parts of the first polysilicon layer;

removing the at least first hardmask region to expose the first polysilicon layer underneath the at least first hardmask region;

removing the exposed parts of the first polysilicon layer underneath the at least first hardmask region to form first and second polysilicon gates having an uniform thickness, one on each side of the at least first hardmask region;

removing the second hardmask spacers and exposing the first and second polysilicon gate; and depositing and patterning a second polysilicon layer perpendicular to the first and second polysilicon gate to form a third polysilicon gate separating the first and the second polysilicon gate.

2. The method of claim 1, further comprising forming an interpoly dielectric isolating the first polysilicon layer from the second polysilicon layer.

3. The method of claim 2, wherein the interpoly dielectric is formed prior to the depositing of the first hardmask layer.

4. The method of claim 2, wherein the interpoly dielectric is formed prior to the depositing of the second polysilicon layer.

5. The method of claim 1, further comprising implanting dopants of a second conductivity type in the semiconductor substrate, after the removal of the exposed parts of the first polysilicon layer selective to the second hardmask spacers and the at least one first hardmask region, to thereby form bitlines.

6. The method of claim 2, further comprising:
   forming a first dielectric layer isolating the first polysilicon layer from the semiconductor substrate; and
   forming a second dielectric layer isolating the second polysilicon layer from the semiconductor substrate.

7. The method of claim 1, further comprising etching the first polysilicon layer to collinearly align at least an edge of the first polysilicon layer with an edge of the second polysilicon layer after depositing and patterning the second polysilicon layer.

8. The method of claim 7, further comprising implanting dopants of a first conductivity type in the semiconductor substrate after depositing and patterning the second polysilicon layer.

9. The method of claim 6, wherein the first and second dielectric layers comprise oxide and the first and the second polysilicon gate form a floating gate.

10. The method of claim 9, further comprising forming in the second polysilicon layer first and second program gates, wherein the first and the second program gates are overlapping with the first and the second polysilicon gates, respectively.

11. A method of claim 10, further comprising etching the first polysilicon layer to collinearly align at least an edge of the first polysilicon layer with an edge of the second polysilicon layer after depositing and patterning the second polysilicon layer.

12. The method of claim 11, further comprising the step of implanting dopants of a second conductivity type in the semiconductor substrate after the step of etching the first polysilicon layer collinearly with the second polysilicon layer.

13. The method of claim 6, wherein the first dielectric layer comprises a charge storing dielectric and the first and the second polysilicon gate forms a program gate.

14. The method of claim 13, wherein the second dielectric layer comprises a charge storing dielectric and the third polysilicon gate forms a program gate.

15. The method of claim 2, further comprising depositing a planarizing dielectric prior to removing the at least one first hardmask region selective to the second hardmask spacers.

16. The method of claim 15, further comprising polishing the planarizing dielectric using the first and/or the second hardmask layer as a polish stop layer.

17. The method of claim 1, further comprising depositing and patterning the first hardmask layer to form another hardmask region alongside one end of the at least one first hardmask region.

18. The method of claim 17, wherein the another hard mask region is positioned such that the second hardmask spacers adjacent the at least one first hardmask region and adjacent the another hard mask region at least partially overlap to thereby define a contact pad area in the first polysilicon layer.

19. A method of forming a multibit non-volatile memory cell structure, comprising:
   providing a semiconductor substrate of a first conductivity type;
   depositing a first polysilicon layer upon the semiconductor substrate;
   depositing and patterning a first hardmask layer to form at least one first hardmask region upon the first polysilicon layer;
   depositing a second polysilicon hardmask layer;
   forming at one end of the at least one first hardmask region a resist region overlapping the at least one first hardmask region, the overlap defining a contact pad area in the first polysilicon layer;
   anisotropically etching the second hardmask layer forming second hardmask spacers adjacent the at least one first hardmask region and an region at the end of the at least one first hardmask region;
   removing the resist region;
   removing the exposed parts of the first polysilicon layer simultaneously with the second hardmask spacers and overlap region selective to the at least one first hardmask region;
   depositing a planarizing dielectric and polishing the planarizing dielectric using the first hardmask region as polish stop layer;
   removing the at least one first hardmask region to thereby form a cavity in the planarizing dielectric and to expose the first polysilicon layer underneath the at least one first hardmask region;
   removing the exposed parts of the first polysilicon layer underneath the at least one first hardmask region to form a first and a second polysilicon gate having a uniform thickness, one on each side of the at least one first hardmask region; and
   depositing, at least in the cavity, and patterning a second polysilicon layer to form a third polysilicon gate separating the first and the second polysilicon gate.

20. The method of claim 1, wherein the removing of the at least first hardmask region is performed subsequent to the selectively removing of exposed parts of the first polysilicon layer.

21. The method of claim 1, wherein the depositing and patterning of a second polysilicon layer is performed subsequent to the removing of the second hardmask spacers.

* * * * *